United States Patent
Nakagawa et al.

(10) Patent No.: US 11,855,609 B2
(45) Date of Patent: Dec. 26, 2023

(54) ACOUSTIC WAVE DEVICE, RADIO-FREQUENCY FRONT END CIRCUIT, AND COMMUNICATION DEVICE

(71) Applicant: Murata Manufacturing Co., Ltd., Nagaokakyo (JP)

(72) Inventors: Ryo Nakagawa, Nagaokakyo (JP); Hideki Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 495 days.

(21) Appl. No.: 17/183,429

(22) Filed: Feb. 24, 2021

(65) Prior Publication Data
US 2021/0184654 A1    Jun. 17, 2021

Related U.S. Application Data

(63) Continuation of application No. PCT/JP2019/035184, filed on Sep. 6, 2019.

(30) Foreign Application Priority Data

Sep. 7, 2018 (JP) .................................. 2018-168266

(51) Int. Cl.
*H03H 9/64* (2006.01)
*H03H 9/02* (2006.01)
(Continued)

(52) U.S. Cl.
CPC ...... *H03H 9/6406* (2013.01); *H03H 9/02543* (2013.01); *H03H 9/14541* (2013.01);
(Continued)

(58) Field of Classification Search
CPC ............. H03H 9/6406; H03H 9/02543; H03H 9/14541; H03H 9/25; H03H 9/6483;
(Continued)

(56) References Cited

U.S. PATENT DOCUMENTS 9,621,128 B2 * 4/2017 Iwamoto ............ H10N 30/1051
2010/0182101 A1   7/2010 Suzuki
(Continued)

FOREIGN PATENT DOCUMENTS

JP   2010-187373 A   8/2010
JP   2014-068123 A   4/2014
(Continued)

OTHER PUBLICATIONS

Official Communication issued in International Patent Application No. PCT/JP2019/035184, dated Nov. 5, 2019.
(Continued)

*Primary Examiner* — Rakesh B Patel
*Assistant Examiner* — Jorge L Salazar, Jr.
(74) *Attorney, Agent, or Firm* — Keating & Bennett, LLP

(57) ABSTRACT

An acoustic wave device includes N band pass filters with first ends connected to define a common connection and having different pass bands. At least one of the band pass filters includes acoustic wave resonators including a lithium tantalate film having Euler angles ($\varphi_{LT}=0°\pm5°$, $\theta_{LT}$, $\psi_{LT}=0°\pm15°$), a silicon support substrate, a silicon oxide film between the lithium tantalate film and the silicon support substrate, an IDT electrode, and a protective film. In at least one acoustic wave resonator, a frequency $f_{h1\_t}^{(n)}$ satisfies Formula (3) or Formula (4) for all m where m>n:

$$f_{h1\_t}^{(n)} > f_u^{(m)} \qquad \text{Formula (3); and}$$

$$f_{h1\_t}^{(n)} < f_l^{(m)} \qquad \text{Formula (4).}$$

In Formulas (3) and (4), $f_u^{(m)}$ and $f_l^{(m)}$ represent the frequencies of the high-frequency end and the low-frequency end of the pass band in the m band pass filters.

22 Claims, 22 Drawing Sheets

(51) Int. Cl.
   *H03H 9/145* (2006.01)
   *H03H 9/25* (2006.01)
   *H03H 9/72* (2006.01)

(52) U.S. Cl.
   CPC ............ *H03H 9/25* (2013.01); *H03H 9/6483* (2013.01); *H03H 9/725* (2013.01)

(58) Field of Classification Search
   CPC ............... H03H 9/725; H03H 9/02559; H03H 9/02574; H04B 1/40
   USPC .......................................................... 333/133
   See application file for complete search history.

(56) References Cited

U.S. PATENT DOCUMENTS

| | | |
|---|---|---|
| 2018/0123556 A1 | 5/2018 | Takamine |
| 2019/0074819 A1 | 3/2019 | Goto et al. |
| 2019/0245519 A1 | 8/2019 | Takamine et al. |
| 2019/0393855 A1 | 12/2019 | Nakagawa et al. |
| 2020/0177157 A1 | 6/2020 | Nakagawa et al. |
| 2020/0287513 A1 | 9/2020 | Yamamoto et al. |

FOREIGN PATENT DOCUMENTS

| | | |
|---|---|---|
| JP | 2019-036963 A | 3/2019 |
| WO | 2016/208447 A1 | 12/2016 |
| WO | 2017/209131 A1 | 12/2017 |
| WO | 2018/092511 A1 | 5/2018 |
| WO | 2018/164211 A1 | 9/2018 |
| WO | 2019/031201 A1 | 2/2019 |
| WO | 2019/082806 A1 | 5/2019 |

OTHER PUBLICATIONS

The Chemical Society of Japan, "Handbook of Chemistry: Pure Chemistry I", Maruzen Publishing Co. Ltd., 5th edition, 2004, p. 697.

The Chemical Society of Japan, "Handbook of Chemistry: Pure Chemistry I", Maruzen Publishing Co. Ltd., 5th edition, 2004, p. 30.

\* cited by examiner (100) PLANE (110) PLANE

ACOUSTIC WAVE DEVICE, RADIO-FREQUENCY FRONT END CIRCUIT, AND COMMUNICATION DEVICE

CROSS REFERENCE TO RELATED APPLICATIONS

This application claims the benefit of priority to Japanese Patent Application No. 2018-168266 filed on Sep. 7, 2018 and is a Continuation Application of PCT Application No. PCT/JP2019/035184 filed on Sep. 6, 2019. The entire contents of each application are hereby incorporated herein by reference.

BACKGROUND OF THE INVENTION

1. Field of the Invention

The present invention relates to an acoustic wave device including two or more acoustic wave filters, a radio-frequency front end circuit including the acoustic wave device, and a communication device.

2. Description of the Related Art

Heretofore, a plurality of acoustic wave filters have been widely used in radio-frequency front end circuits of mobile phones and smartphones. For example, in a splitter disclosed in Japanese Unexamined Patent Application Publication No. 2014-68123, first ends of two or more band pass filters of different frequencies are connected to each other forming a common connection. Each band pass filter is formed of a surface acoustic wave filter chip. Each surface acoustic wave filter chip includes a plurality of surface acoustic wave resonators.

Japanese Unexamined Patent Application Publication No. 2010-187373 discloses an acoustic wave device in which an acoustic wave resonator is formed by stacking an insulating film including silicon dioxide and a piezoelectric substrate including lithium tantalate on a silicon support substrate. Heat resistance is improved by bonding the layers at the (111) plane of silicon.

In the acoustic wave device disclosed in Japanese Unexamined Patent Application Publication No. 2014-68123, a plurality of acoustic wave filters having different frequencies are connected to each other forming a common connection on the side near an antenna terminal.

The inventors of preferred embodiments of the present invention discovered that a plurality of spurious responses appear on the high-frequency side of the utilized main mode in an acoustic wave resonator in which a lithium tantalate film is directly or indirectly stacked on a silicon support substrate. When such an acoustic wave resonator is used in an acoustic wave filter having a lower pass band in an acoustic wave device, there is a danger that a spurious response that appears in this acoustic wave filter will appear in the pass band of another acoustic wave filter having a higher pass band. Therefore, there is a risk of the filter characteristics of the other acoustic wave filter being degraded.

SUMMARY OF THE INVENTION

Preferred embodiments of the present invention provide acoustic wave devices in each of which a ripple due to such a spurious response is unlikely to occur inside the pass band of another band pass filter, radio-frequency front end circuits including such acoustic wave devices, and communication devices.

An acoustic wave device according to a first preferred embodiment of the present invention includes N (N is an integer greater than or equal to 2) band pass filters including first ends connected to each other so as to define a common connection and having different pass bands from each other. When the N band pass filters are referred to as a band pass filter (1), a band pass filter (2), ... and a band pass filter (N) in ascending order of pass band frequency, at least one band pass filter (n) ($1 \leq n < N$), other than the band pass filter having the highest pass band frequency, among the N band pass filters is an acoustic wave filter that includes one or more acoustic wave resonators. At least one acoustic wave resonator (t) among the one or more acoustic wave resonators includes a silicon support substrate having Euler angles ($\varphi_{Si}$, $\theta_{Si}$, $\psi_{Si}$), a silicon oxide film stacked above the silicon support substrate, a lithium tantalate film stacked above the silicon oxide film and having Euler angles ($\varphi_{LT}=0°\pm5°$, $\theta_{LT}$, $\psi_{LT}=0°\pm15°$), an IDT electrode provided above the lithium tantalate film and including electrode fingers, and a protective film that covers at least a portion of the IDT electrode. In the acoustic wave resonator (t), when $\lambda$ is a wavelength determined by an electrode finger pitch of the IDT electrode and a thickness normalized using the wavelength $\lambda$ is referred to as a wavelength-normalized thickness, and when $T_{LT}$ is a wavelength-normalized thickness of the lithium tantalate film, $\theta_{LT}$ is a Euler angle of the lithium tantalate film, $T_S$ is a wavelength-normalized thickness of the silicon oxide film, $T_E$ is a wavelength-normalized thickness of the IDT electrode converted into a thickness of aluminum obtained as the product of a wavelength-normalized thickness of the IDT electrode and a value obtained by dividing a density of the IDT electrode by a density of aluminum, $T_P$ is a wavelength-normalized thickness of the protective film obtained as the product of a value obtained by dividing a density of the protective film by a density of silicon oxide and a wavelength-normalized thickness obtained by normalizing a thickness of the protective film using the wavelength $\lambda$, $\psi_{Si}$ is a propagation direction inside the silicon support substrate, and $T_{Si}$ is a wavelength-normalized thickness of the silicon support substrate, a first frequency $f_{h1\_t}^{(n)}$, where $s=1$ among first, second, and third frequencies $f_{hs\_t}^{(n)}$ determined by Formula (1) and Formula (2) below determined using $T_{LT}$, $\theta_{LT}$, $T_S$, $T_E$, $T_P$, $\psi_{Si}$, and $T_{Si}$ and all band pass filters (m) ($n<m\leq N$) having pass bands located at a higher frequency than the pass band of the band pass filter (n) satisfy Formula (3) or Formula (4) below:

$$V_h = \quad \text{Formula (1)}$$
$$\left(a_{T_{LT}}^{(3)}\left((T_{LT}-c_{T_{LT}})^3 - b_{T_{LT}}^{(3)}\right) + a_{T_{LT}}^{(2)}\left((T_{LT}-c_{T_{LT}})^2 - b_{T_{LT}}^{(2)}\right) + \right.$$
$$a_{T_{LT}}^{(1)}(T_{LT}-c_{T_{LT}}) + a_{T_S}^{(2)}\left((T_S-c_{T_S})^2 - b_{T_S}^{(2)}\right) +$$
$$a_{T_S}^{(1)}(T_S-c_{T_S}) + a_{T_E}^{(1)}(T_E-c_{T_E}) + a_{\psi_{Si}}^{(5)}\left((\psi_{Si}-c_{\psi_{Si}})^5 - b_{\psi_{Si}}^{(5)}\right) +$$
$$a_{\psi_{Si}}^{(4)}\left((\psi_{Si}-c_{\psi_{Si}})^4 - b_{\psi_{Si}}^{(4)}\right) + a_{\psi_{Si}}^{(3)}\left((\psi_{Si}-c_{\psi_{Si}})^3 - b_{\psi_{Si}}^{(3)}\right) +$$
$$a_{\psi_{Si}}^{(2)}\left((\psi_{Si}-c_{\psi_{Si}})^2 - b_{\psi_{Si}}^{(2)}\right) + a_{\psi_{Si}}^{(1)}(\psi_{Si}-c_{\psi_{Si}}) +$$
$$a_{\theta_{LT}}^{(2)}\left((\theta_{LT}-c_{\theta_{LT}})^2 - b_{\theta_{LT}}^{(2)}\right) + a_{\theta_{LT}}^{(1)}(\theta_{LT}-c_{\theta_{LT}}) +$$

-continued $$d_{T_{LT}T_S}(T_{LT} - c_{T_{LT}})(T_S - c_{T_S}) + d_{T_{LT}T_E}(T_{LT} - c_{T_{LT}})$$
$$(T_E - c_{T_E}) + d_{T_{LT}\psi_{Si}}(T_{LT} - c_{T_{LT}})(\psi_{Si} - c_{\psi_{Si}}) + e)$$
$$(a_{T_P}T_P^3 + b_{T_P}T_P^2 + c_{T_P}T_P^2 + d_{T_P});$$

$$f_{h_{s\_t}}^{(n)} = \frac{V_{h_{s\_t}}}{\lambda_t^{(n)}};$$  Formula (2)

$$f_{h_{s\_t}}^{(n)} > f_u^{(m)}; \text{ and}$$  Formula (3)

$$f_{h_{s\_t}}^{(n)} < f_l^{(m)},$$  Formula (4)

where s=1 in Formulas (2) to (4).

$\lambda_t^{(n)}$ is a wavelength determined by an electrode finger pitch of the IDT electrode of the acoustic wave resonator (t) included in the band pass filter (n), $f_u^{(m)}$ is a frequency of a high-frequency end of the pass band of the band pass filter (m), $f_l^{(m)}$ is a frequency of a low-frequency end of the pass band of the band pass filter (m), and coefficients in Formula (1) have values as listed below in Table 1 for the various crystal orientations of the silicon support substrate:

TABLE 1

| | s = 1 | | |
|---|---|---|---|
| | Si(100) | Si(110) | Si(111) |
| $a_{T_{LT}}^{(3)}$ | 0 | 0 | 0 |
| $a_{T_{LT}}^{(2)}$ | 0 | 0 | 0 |
| $a_{T_{LT}}^{(1)}$ | −436.3811104 | 0 | 0 |
| $b_{T_{LT}}^{(3)}$ | 0 | 0 | 0 |
| $b_{T_{LT}}^{(2)}$ | 0 | 0 | 0 |
| $c_{T_{LT}}$ | 0.251271186 | 0 | 0 |
| $a_{T_S}^{(2)}$ | 0 | 0 | 0 |
| $a_{T_S}^{(1)}$ | −370.8189665 | 0 | −174.7116877 |
| $b_{T_S}^{(2)}$ | 0 | 0 | 0 |
| $c_{T_S}$ | 0.250529661 | 0 | 0.24371308 |
| $a_{T_E}^{(1)}$ | 0 | 0 | 0 |
| $c_{T_E}$ | 0 | 0 | 0 |
| $a_{\psi_{Si}}^{(5)}$ | 0 | −6.73542E−06 | 0 |
| $a_{\psi_{Si}}^{(4)}$ | 0 | −4.84328E−05 | 0.000703463 |
| $a_{\psi_{Si}}^{(3)}$ | 0.044803063 | 0.020121569 | −4.77016E−05 |
| $a_{\psi_{Si}}^{(2)}$ | −0.11149637 | 0.237494527 | −0.961938987 |
| $a_{\psi_{Si}}^{(1)}$ | −43.37704861 | −1.22341255 | 0.091605753 |
| $b_{\psi_{Si}}^{(5)}$ | 0 | −78830.27657 | 0 |
| $b_{\psi_{Si}}^{(4)}$ | 0 | 1406271.562 | 340944.6167 |
| $b_{\psi_{Si}}^{(3)}$ | 51.32996847 | −17.77613547 | −41.61537323 |
| $b_{\psi_{Si}}^{(2)}$ | 280.2660593 | 895.2921635 | 446.7591732 |
| $c_{\psi_{Si}}$ | 22.32521186 | 45.02689779 | 30.11392405 |
| $a_{\theta_{LT}}^{(2)}$ | 0 | 0 | 0 |
| $a_{\theta_{LT}}^{(1)}$ | 0 | 0 | 0 |
| $b_{\theta_{LT}}^{(2)}$ | 0 | 0 | 0 |
| $c_{\theta_{LT}}$ | −90 | −90 | −90 |
| $d_{T_{LT}TS}$ | 0 | 0 | 0 |
| $d_{T_{LT}TE}$ | 0 | 0 | 0 |
| $d_{T_{LT}\psi_{Si}}$ | 0 | 0 | 0 |
| e | 5141.869703 | 5073.066348 | 4781.489451 |
| $a_{T_P}$ | 0 | 0 | 0 |
| $b_{T_P}$ | 0.02 | 0.02 | 0.02 |
| $c_{T_P}$ | −0.0102 | −0.0102 | −0.0102 |
| $d_{T_P}$ | 1.0002 | 1.0002 | 1.0002. |

An acoustic wave device according to a second preferred embodiment of the present invention includes N (N is an integer greater than or equal to 2) band pass filters including first ends connected to each other so as to define a common connection and having different pass bands from each other. When the N band pass filters are referred to as a band pass filter (1), a band pass filter (2), . . . and a band pass filter (N) in ascending order of pass band frequency, at least one band pass filter (n) (1≤n<N), other than the band pass filter having the highest pass band frequency, among the N band pass filters is an acoustic wave filter that includes one or more acoustic wave resonators. At least one acoustic wave resonator (t) among the one or more acoustic wave resonators includes a silicon support substrate having Euler angles ($T_{Si}$, $\theta_{Si}$, $\psi_{Si}$), a silicon oxide film stacked above the silicon support substrate, a lithium tantalate film stacked above the silicon oxide film and having Euler angles ($\varphi_{LT}=0°\pm5°$, $\theta_{LT}$, $\psi_{LT}=0°\pm15°$), an IDT electrode provided above the lithium tantalate film and including electrode fingers, and a protective film that covers at least a portion of the IDT electrode. In the acoustic wave resonator (t), when λ is a wavelength determined by an electrode finger pitch of the IDT electrode and a thickness normalized using the wavelength λ is referred to as a wavelength-normalized thickness, and when $T_{LT}$ is a wavelength-normalized thickness of the lithium tantalate film, $\theta_{LT}$ is a Euler angle of the lithium tantalate film, $T_S$ is a wavelength-normalized thickness of the silicon oxide film, $T_E$ is a wavelength-normalized thickness of the IDT electrode converted into a thickness of aluminum obtained as a product of a wavelength-normalized thickness of the IDT electrode and a value obtained by dividing a density of the IDT electrode by a density of aluminum, $T_P$ is a wavelength-normalized thickness of the protective film obtained as a product of a value obtained by dividing a density of the protective film by a density of silicon oxide and a wavelength-normalized thickness obtained by normalizing a thickness of the protective film using the wavelength λ, $\psi_{Si}$ is a propagation direction inside the silicon support substrate, and $T_{Si}$ is a wavelength-normalized thickness of the silicon support substrate, a second frequency $f_{h2\_t}^{(n)}$, where s=2 among first, second, and third frequencies $f_{hs\_t}^{(n)}$ determined by Formula (1) and Formula (2) below determined using $T_{LT}$, $\theta_{LT}$, $T_S$, $T_E$, $T_P$, $\psi_{Si}$, and $T_{Si}$ and all band pass filters (m) (n<m≤N) having pass bands located at a higher frequency than the pass band of the band pass filter (n) satisfy Formula (3) or Formula (4):

$$V_h =$$  Formula (1)

$$(a_{T_{LT}}^{(3)}((T_{LT} - c_{T_{LT}})^3 - b_{T_{LT}}^{(3)}) + a_{T_{LT}}^{(2)}((T_{LT} - c_{T_{LT}})^2 - b_{T_{LT}}^{(2)}) +$$
$$a_{T_{LT}}^{(1)}(T_{LT} - c_{T_{LT}}) + a_{T_S}^{(2)}((T_S - c_{T_S})^2 - b_{T_S}^{(2)}) +$$
$$a_{T_S}^{(1)}(T_S - c_{T_S}) + a_{T_E}^{(1)}(T_E - c_{T_E}) + a_{\psi_{Si}}^{(5)}((\psi_{Si} - c_{\psi_{Si}})^5 - b_{\psi_{Si}}^{(5)}) +$$
$$a_{\psi_{Si}}^{(4)}((\psi_{Si} - c_{\psi_{Si}})^4 - b_{\psi_{Si}}^{(4)}) + a_{\psi_{Si}}^{(3)}((\psi_{Si} - c_{\psi_{Si}})^3 - b_{\psi_{Si}}^{(3)}) +$$
$$a_{\psi_{Si}}^{(2)}((\psi_{Si} - c_{\psi_{Si}})^2 - b_{\psi_{Si}}^{(2)}) + a_{\psi_{Si}}^{(1)}(\psi_{Si} - c_{\psi_{Si}}) +$$
$$a_{\theta_{LT}}^{(2)}((\theta_{LT} - c_{\theta_{LT}})^2 - b_{\theta_{LT}}^{(2)}) + a_{\theta_{LT}}^{(1)}(\theta_{LT} - c_{\theta_{LT}}) +$$
$$d_{T_{LT}T_S}(T_{LT} - c_{T_{LT}})(T_S - c_{T_S}) + d_{T_{LT}T_E}(T_{LT} - c_{T_{LT}})$$
$$(T_E - c_{T_E}) + d_{T_{LT}\psi_{Si}}(T_{LT} - c_{T_{LT}})(\psi_{Si} - c_{\psi_{Si}}) + e)$$
$$(a_{T_P}T_P^3 + b_{T_P}T_P^2 + c_{T_P}T_P^2 + d_{T_P});$$

$$f_{h_{s\_t}}^{(n)} = \frac{V_{h_{s\_t}}}{\lambda_t^{(n)}};$$  Formula (2)

$$f_{h_{s\_t}}^{(n)} > f_u^{(m)}; \text{ and}$$  Formula (3)

$$f_{h_{s\_t}}^{(n)} < f_l^{(m)},$$  Formula (4)

where s=2 in Formulas (2) to (4).

$\lambda_t^{(n)}$ is a wavelength determined by an electrode finger pitch of the IDT electrode of the acoustic wave resonator (t) included in the band pass filter (n), $f_u^{(m)}$ is a frequency of a high-frequency end of the pass band of the band pass filter (m), $f_l^{(m)}$ is a frequency of a low-frequency end of the pass band of the band pass filter (m), and coefficients in Formula (1) have values as listed in Table 2 below for the various crystal orientations of the silicon support substrate:

TABLE 2

| | s = 2 | | |
|---|---|---|---|
| | Si(100) | Si(110) | Si(111) |
| $a_{T_{LT}}^{(3)}$ | 0 | 0 | 0 |
| $a_{T_{LT}}^{(2)}$ | −3168.980655 | −3017.48047 | −6490.588929 |
| $a_{T_{LT}}^{(1)}$ | −1070.770975 | −1740.800945 | −1736.124534 |
| $b_{T_{LT}}^{(3)}$ | 0 | 0 | 0 |
| $b_{T_{LT}}^{(2)}$ | 0.012520877 | 0.011673567 | 0.012932291 |
| $c_{T_{LT}}$ | 0.25 | 0.26454918 | 0.244042365 |
| $a_{T_S}^{(2)}$ | 0 | 0 | −5447.157686 |
| $a_{T_S}^{(1)}$ | −1175.713239 | −1443.794269 | −1260.230106 |
| $b_{T_S}^{(2)}$ | 0 | 0 | 0.012411464 |
| $c_{T_S}$ | 0.250104384 | 0.264754098 | 0.243336275 |
| $a_{T_E}^{(1)}$ | −440.9839549 | −631.5739347 | −613.3480905 |
| $c_{T_E}$ | 0.249686848 | 0.254030055 | 0.249646955 |
| $a_{\psi_{Si}}^{(5)}$ | 0 | 0 | 0 |
| $a_{\psi_{Si}}^{(4)}$ | 0 | −8.39122E−05 | 0 |
| $a_{\psi_{Si}}^{(3)}$ | −0.01385161 | −0.000219614 | 0 |
| $a_{\psi_{Si}}^{(2)}$ | 0.040113138 | 0.288564318 | 0.113517332 |
| $a_{\psi_{Si}}^{(1)}$ | 10.06827612 | −1.021332326 | 0.01604077 |
| $b_{\psi_{Si}}^{(5)}$ | 0 | 0 | 0 |
| $b_{\psi_{Si}}^{(4)}$ | 0 | 1489555.068 | 0 |
| $b_{\psi_{Si}}^{(3)}$ | −14.09179662 | −1671.679914 | 0 |
| $b_{\psi_{Si}}^{(2)}$ | 281.2490194 | 936.1444126 | 446.7377612 |
| $c_{\psi_{Si}}$ | 22.53131524 | 46.09631148 | 29.70873786 |
| $a_{\theta_{LT}}^{(2)}$ | 0 | 0 | 0 |
| $a_{\theta_{LT}}^{(1)}$ | −2.926997767 | 0 | 0 |
| $b_{\theta_{LT}}^{(2)}$ | 0 | 0 | 0 |
| $c_{\theta_{LT}}$ | −50.02087683 | −90 | −90 |
| $d_{T_{LT}T_S}$ | 0 | 0 | 0 |
| $d_{T_{LT}T_E}$ | −2151.133017 | −2785.629029 | −2639.620065 |
| $d_{T_{LT}\psi_{Si}}$ | 17.13925013 | 0 | 0 |
| e | 5188.573706 | 5052.799929 | 5187.888817 |
| $a_{T_P}$ | 0 | 0 | 0 |
| $b_{T_P}$ | −0.1336 | −0.1336 | −0.1336 |
| $c_{T_P}$ | −0.0552 | −0.0552 | −0.0552 |
| $d_{T_P}$ | 1.001 | 1.001 | 1.001. |

An acoustic wave device according to a third preferred embodiment of the present invention includes N (N is an integer greater than or equal to 2) band pass filters including first ends connected to each other so as to define a common connection and having different pass bands from each other. When the N band pass filters are referred to as a band pass filter (1), a band pass filter (2), . . . and a band pass filter (N) in ascending order of pass band frequency, at least one band pass filter (n) ($1 \leq n < N$), other than the band pass filter having the highest pass band frequency, among the N band pass filters is an acoustic wave filter that includes one or more acoustic wave resonators. At least one acoustic wave resonator (t) among the one or more acoustic wave resonators includes a silicon support substrate having Euler angles ($\varphi_{Si}$, $\theta_{Si}$, $\psi_{Si}$), a silicon oxide film stacked above the silicon support substrate, a lithium tantalate film stacked above the silicon oxide film and having Euler angles ($\varphi_{LT}=0°\pm5°$, $\theta_{LT}$, $\psi_{LT}=0°\pm15°$), an IDT electrode provided above the lithium tantalate film and including electrode fingers, and a protective film that covers at least a portion of the IDT electrode. In the acoustic wave resonator (t), when $\lambda$ is a wavelength determined by an electrode finger pitch of the IDT electrode and a thickness normalized using the wavelength $\lambda$ is referred to as a wavelength-normalized thickness, and when $T_{LT}$ is a wavelength-normalized thickness of the lithium tantalate film, $\theta_{LT}$ is a Euler angle of the lithium tantalate film, $T_S$ is a wavelength-normalized thickness of the silicon oxide film, $T_E$ is a wavelength-normalized thickness of the IDT electrode converted into a thickness of aluminum obtained as a product of a wavelength-normalized thickness of the IDT electrode and a value obtained by dividing a density of the IDT electrode by a density of aluminum, $T_P$ is a wavelength-normalized thickness of the protective film obtained as a product of a value obtained by dividing a density of the protective film by a density of silicon oxide and a wavelength-normalized thickness obtained by normalizing a thickness of the protective film using the wavelength $\lambda$, $\psi_{Si}$ is a propagation direction inside the silicon support substrate, and $T_{Si}$ is a wavelength-normalized thickness of the silicon support substrate, a third frequency $f_{h3\_t}^{(n)}$, where s=3 among first, second, and third frequencies $f_{hs\_t}^{(n)}$ determined by Formula (1) and Formula (2) below determined using $T_{LT}$, $\theta_{LT}$, $T_S$, $T_E$, $T_P$, $\psi_{Si}$, and $T_{Si}$ and all band pass filters (m) ($n < m \leq N$) having pass bands located at a higher frequency than the pass band of the band pass filter (n) satisfy Formula (3) or Formula (4) below:

$$V_h = \quad \text{Formula (1)}$$

$$\left(a_{T_{LT}}^{(3)}\left((T_{LT}-c_{T_{LT}})^3 - b_{T_{LT}}^{(3)}\right) + a_{T_{LT}}^{(2)}\left((T_{LT}-c_{T_{LT}})^2 - b_{T_{LT}}^{(2)}\right) + \right.$$
$$a_{T_{LT}}^{(1)}(T_{LT}-c_{T_{LT}}) + a_{T_S}^{(2)}\left((T_S-c_{T_S})^2 - b_{T_S}^{(2)}\right) +$$
$$a_{T_S}^{(1)}(T_S-c_{T_S}) + a_{T_E}^{(1)}(T_E-c_{T_E}) + a_{\psi_{Si}}^{(5)}\left((\psi_{Si}-c_{\psi_{Si}})^5 - b_{\psi_{Si}}^{(5)}\right) +$$
$$a_{\psi_{Si}}^{(4)}\left((\psi_{Si}-c_{\psi_{Si}})^4 - b_{\psi_{Si}}^{(4)}\right) + a_{\psi_{Si}}^{(3)}\left((\psi_{Si}-c_{\psi_{Si}})^3 - b_{\psi_{Si}}^{(3)}\right) +$$
$$a_{\psi_{Si}}^{(2)}\left((\psi_{Si}-c_{\psi_{Si}})^2 - b_{\psi_{Si}}^{(2)}\right) + a_{\psi_{Si}}^{(1)}(\psi_{Si}-c_{\psi_{Si}}) +$$
$$a_{\theta_{LT}}^{(2)}\left((\theta_{LT}-c_{\theta_{LT}})^2 - b_{\theta_{LT}}^{(2)}\right) + a_{\theta_{LT}}^{(1)}(\theta_{LT}-c_{\theta_{LT}}) +$$
$$d_{T_{LT}T_S}(T_{LT}-c_{T_{LT}})(T_S-c_{T_S}) + d_{T_{LT}T_E}(T_{LT}-c_{T_{LT}})$$
$$(T_E-c_{T_E}) + d_{T_{LT}\psi_{Si}}(T_{LT}-c_{T_{LT}})(\psi_{Si}-c_{\psi_{Si}}) + e\right)$$
$$\left(a_{T_P}T_P^3 + b_{T_P}T_P^2 + c_{T_P}T_P^2 + d_{T_P}\right);$$

$$f_{hs\_t}^{(n)} = \frac{V_{hs\_t}}{\lambda_t^{(n)}}; \quad \text{Formula (2)}$$

$$f_{hs\_t}^{(n)} > f_u^{(m)}; \text{ and} \quad \text{Formula (3)}$$

$$f_{hs\_t}^{(n)} < f_l^{(m)}, \quad \text{Formula (4)}$$

where s=3 in Formulas (2) to (4).

$\lambda_t^{(n)}$ is a wavelength determined by an electrode finger pitch of the IDT electrode of the acoustic wave resonator (t) included in the band pass filter (n), $f_u^{(m)}$ is a frequency of a high-frequency end of the pass band of the band pass filter (m), $f_l^{(m)}$ is a frequency of a low-frequency end of the pass band of the band pass filter (m), and coefficients in Formula (1) have values as listed in below Table 3 for the various crystal orientations of the silicon support substrate;

TABLE 3

| | s = 3 | | |
|---|---|---|---|
| | Si(100) | Si(110) | Si(111) |
| $a_{T_{LT}}^{(3)}$ | 24973.69604 | 0 | 0 |
| $a_{T_{LT}}^{(2)}$ | 1430.312613 | 0 | −6156.310187 |
| $a_{T_{LT}}^{(1)}$ | −1027.290569 | −737.4915071 | −1476.525631 |
| $b_{T_{LT}}^{(3)}$ | −0.000364885 | 0 | 0 |
| $b_{T_{LT}}^{(2)}$ | 0.011041041 | 0 | 0.009760415 |
| $c_{T_{LT}}$ | 0.277376171 | 0.283128295 | 0.290986602 |
| $a_{T_S}^{(2)}$ | 0 | 0 | 0 |
| $a_{T_S}^{(1)}$ | −617.0601012 | 0 | 0 |
| $b_{T_S}^{(2)}$ | 0 | 0 | 0 |
| $c_{T_S}$ | 0.273226238 | 0 | 0 |
| $a_{T_E}^{(1)}$ | −254.6645301 | −400.406917 | −524.8090015 |
| $c_{T_E}$ | 0.262449799 | 0.265026362 | 0.25499391 |

TABLE 3-continued

| | s = 3 | | |
|---|---|---|---|
| | Si(100) | Si(110) | Si(111) |
| $a_{\psi Si}^{(5)}$ | 0 | 0 | 0 |
| $a_{\psi Si}^{(4)}$ | 0 | −0.000208283 | −0.000637441 |
| $a_{\psi Si}^{(3)}$ | 0 | −0.004709453 | −0.001817349 |
| $a_{\psi Si}^{(2)}$ | −0.126294383 | 0.574442977 | 0.749991624 |
| $a_{\psi Si}^{(1)}$ | 2.746835794 | 7.891650217 | −0.116425099 |
| $b_{\psi Si}^{(5)}$ | 0 | 0 | 0 |
| $b_{\psi Si}^{(4)}$ | 0 | 1654327.754 | 303345.3736 |
| $b_{\psi Si}^{(3)}$ | 0 | −7229.860818 | −201.8986483 |
| $b_{\psi Si}^{(2)}$ | 266.9400494 | 985.3381236 | 411.1815157 |
| $c_{\psi Si}$ | 22.10843373 | 47.8602812 | 30.42021924 |
| $a_{\theta LT}^{(2)}$ | 0 | 0 | 0.593925697 |
| $a_{\theta LT}^{(1)}$ | 0 | 0 | −2.75182308 |
| $b_{\theta LT}^{(2)}$ | 0 | 0 | 67.60597649 |
| $c_{\theta LT}$ | −90 | −90 | −49.6589525 |
| $d_{TLTTS}$ | −2391.060714 | 0 | 0 |
| $d_{TLTTE}$ | 0 | 0 | −2773.934251 |
| $d_{TLT\psi Si}$ | −12.5134053 | 15.88855602 | 0 |
| e | 5661.675305 | 5417.174527 | 5440.57579 |
| $a_{TP}$ | 10.443 | 10.443 | 10.443 |
| $b_{TP}$ | −0.0316 | −0.0316 | −0.0316 |
| $c_{TP}$ | −0.0653 | −00653 | −0.0653 |
| $d_{TP}$ | 1.0011 | 1.0011 | 1.0011. |

With each of the acoustic wave devices according to preferred embodiments of the present invention, a spurious response generated by at least one acoustic wave resonator of a band pass filter having a lower pass band is unlikely to occur inside the pass band of another band pass filter having a higher pass band. Thus, degradation of the filter characteristics of the other band pass filter is unlikely to occur. Therefore, radio-frequency front end circuits and communication devices that each include such an acoustic wave device provide excellent filter characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, the present invention will be made clearer by describing specific preferred embodiments of the present invention with reference to the drawings.

The preferred embodiments of the present invention described in the present specification are illustrative examples and it should be noted that portions of the configurations illustrated in different preferred embodiments can be substituted for one another or combined with one another.

First Preferred Embodiment

Figure 1:
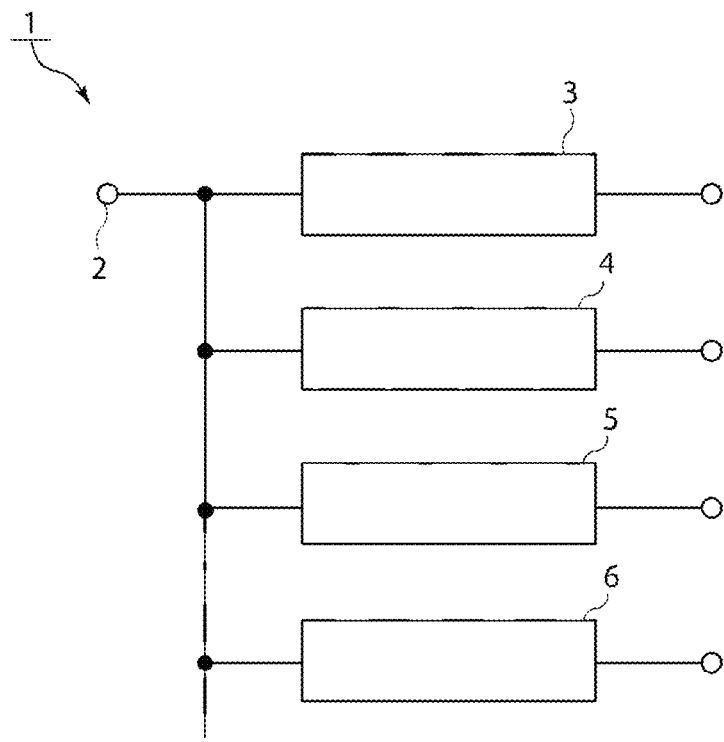
FIG. 1 is a circuit diagram of an acoustic wave device according to a first preferred embodiment of the present invention.

FIG. 1 is a circuit diagram of an acoustic wave device according to a first preferred embodiment of the present invention. An acoustic wave device 1 includes an antenna terminal 2. The antenna terminal 2 is connected to the antenna of a smartphone, for example.

In the acoustic wave device 1, first to fourth acoustic wave filters 3 to 6 are connected to the antenna terminal 2 via a common connection. The first to fourth acoustic wave filters 3 to 6 preferably are band pass filters. Note that although the first to fourth acoustic wave filters 3 to 6 are used as a plurality of band pass filters, it is not necessary for all of the plurality of band pass filters to be acoustic wave filters in the present invention. In other words, in an acoustic wave device that includes N band pass filters including first ends that are connected to each other so as to define a common connection and that have different pass bands from each other, it is sufficient that at least one band pass filter, other than the band pass filter having the highest pass band frequency, among the N band pass filters is an acoustic wave filter that includes the acoustic wave resonator described below. Therefore, the commonly connected band pass filters may be, for example, LC filters or another type of filter other than acoustic wave filters.

Figure 4:
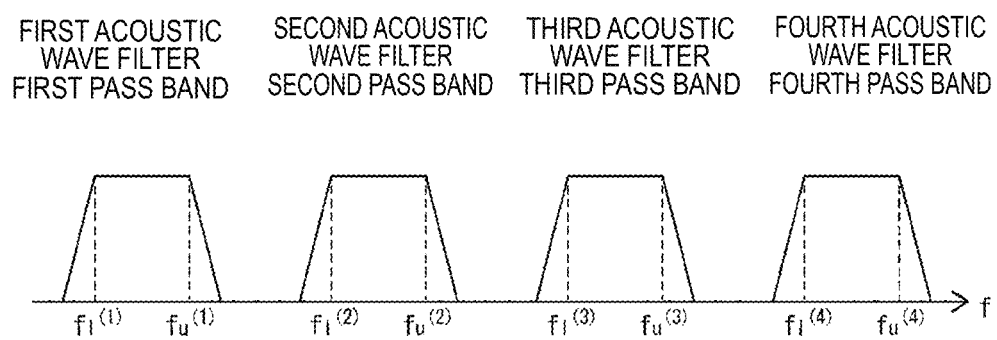
FIG. 4 is a schematic diagram illustrating the pass bands of first to fourth acoustic wave filters in the first preferred embodiment of the present invention.

FIG. 4 is a schematic diagram illustrating the relationship between the pass bands of the first to fourth acoustic wave filters. As illustrated in FIG. 4, the first to fourth acoustic wave filters have different pass bands from each other. The pass bands of the first to fourth acoustic wave filters are respectively referred to as first to fourth pass bands.

The first pass band is nearest the low frequency side and the frequencies of the second pass band, the third pass band, and the fourth pass band increase in this order. In other words, first pass band<second pass band<third pass band<fourth pass band. In the second to fourth pass bands, a low-frequency end is denoted as $f_l^{(m)}$ and a high-frequency end is denoted as $f_u^{(m)}$. The low-frequency end is the low-frequency end of the pass band. In addition, the high-frequency end is the high-frequency end of the pass band. For example, the ends of the frequency bands of the bands standardized in 3GPP or the like may preferably be used as the low-frequency ends and high-frequency ends of the pass bands.

Here, (m) is 2, 3, or 4 for the second to fourth pass bands. In other words, m represents the numbers of the acoustic wave filters other than the aforementioned acoustic wave filter.

Figure 2:
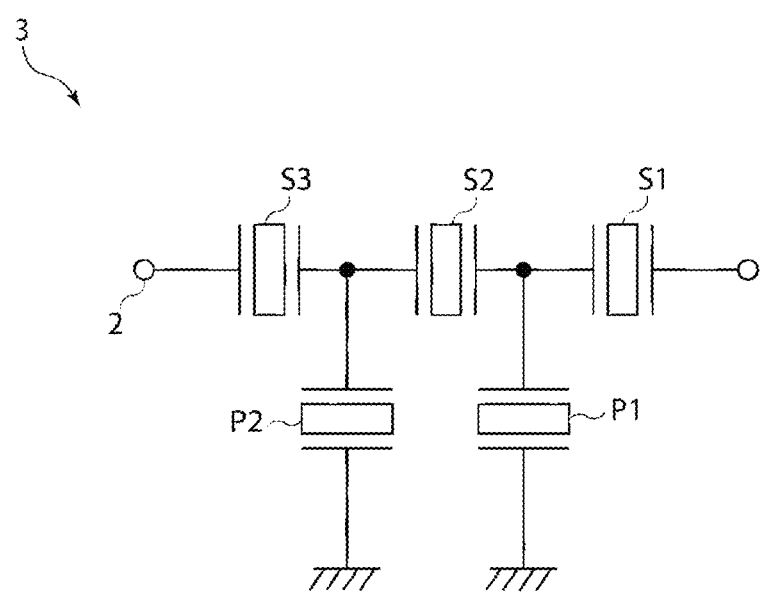
FIG. 2 is a circuit diagram illustrating a first acoustic wave filter that is used in the acoustic wave device of the first preferred embodiment of the present invention.

The first to fourth acoustic wave filters 3 to 6 each include a plurality of acoustic wave resonators. FIG. 2 is a circuit diagram of the first acoustic wave filter 3. The first acoustic wave filter 3 includes series arm resonators S1 to S3 and parallel arm resonators P1 and P2, which are each defined by an acoustic wave resonator. In other words, the first acoustic wave filter 3 is a ladder filter. However, the number of series arm resonators and the number of parallel arm resonators in the ladder filter are not limited to the numbers illustrated in this example.

Furthermore, the second to fourth acoustic wave filters 4 to 6 are similarly each defined by a ladder filter and include a plurality of series arm resonators and a plurality of parallel arm resonators.

Provided that the first to fourth acoustic wave filters 3 to 6 include a plurality of acoustic wave resonators, the first to fourth acoustic wave filters 3 to 6 may have a circuit configuration other than a ladder filter. For example, the first to fourth acoustic wave filters 3 to 6 may each be an acoustic wave filter in which an acoustic wave resonator is serially connected to a longitudinally coupled resonator acoustic wave filter. In addition, the first to fourth acoustic wave filters 3 to 6 may each be an acoustic wave filter in which a ladder filter is connected to a longitudinally coupled resonator acoustic wave filter.

Figure 3A:
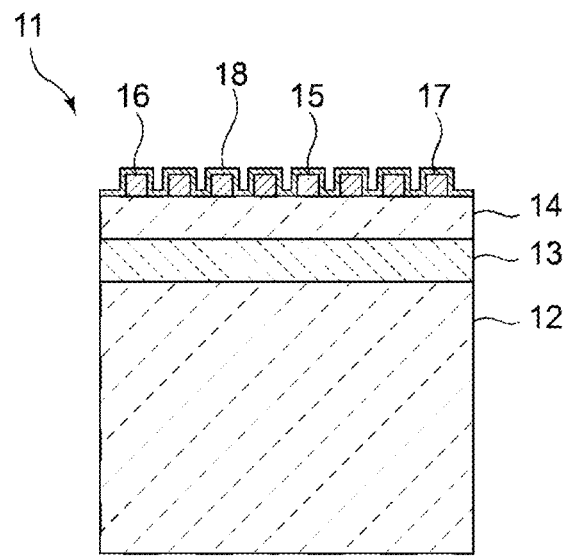
FIG. 3A is a schematic front cross-sectional view of an acoustic wave resonator used in the acoustic wave device of the first preferred embodiment of the present invention and FIG. 3B is a schematic plan view illustrating the electrode structure of the acoustic wave resonator.
Figure 3B:
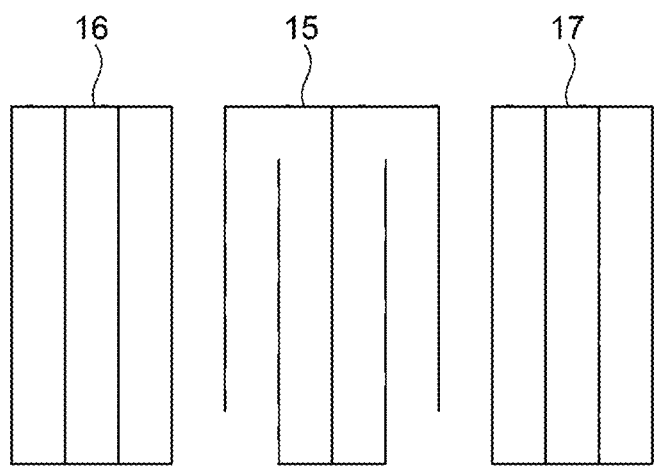

FIG. 3A is a schematic front cross-sectional view of an acoustic wave resonator used for the series arm resonators S1 to S3 or the parallel arm resonators P1 and P2 of the first acoustic wave filter 3 and FIG. 3B is a schematic plan view illustrating the electrode structure thereof.

An acoustic wave resonator 11 includes a silicon support substrate 12, a silicon oxide film 13 stacked above the silicon support substrate 12, and a lithium tantalate film 14 stacked above the silicon oxide film 13.

The silicon support substrate 12 is preferably made of silicon, for example. The silicon support substrate 12 preferably includes single crystal silicon, for example, but it is sufficient that the silicon support substrate 12 have a crystal orientation and does not need to be a perfect single crystal. The silicon oxide film 13 is preferably a $SiO_2$ film, for example. The silicon oxide film 13 may include $SiO_2$ doped with fluorine or the like, for example, as long as the silicon oxide film 13 includes silicon oxide. The silicon oxide film 13 may have a multilayer structure including a plurality of layers made of silicon oxide. Intermediate layers made of, for example, titanium or nickel may be included between the plurality of layers. The thickness of the silicon oxide film 13 in this case refers to the total thickness of the multilayer structure. The lithium tantalate film 14 is preferably a single crystal lithium tantalate film, but it is sufficient that the lithium tantalate film 14 have a crystal orientation and does not have to be a perfect single crystal.

The thickness of the silicon oxide film 13 may be 0. In other words, the silicon oxide film 13 does not necessarily have to be provided.

An interdigital transducer (IDT) electrode 15 is provided above the upper surface of the lithium tantalate film 14. More specifically, reflectors 16 and 17 are provided on both sides of the IDT electrode 15 in the acoustic wave propagation direction, thus defining a one-port surface acoustic wave resonator.

A protective film 18 covers the IDT electrode 15 and the reflectors 16 and 17. The protective film 18 is preferably made of, for example, a silicon oxide film in the present preferred embodiment. However, the protective film 18 may be made of any of various dielectric films, such as a silicon oxynitride film or a silicon nitride film, for example. In addition, in the present preferred embodiment, the protective film 18 covers not only the electrode fingers of the IDT electrode 15 but also the upper surface of the lithium tantalate film 14 and both side surfaces of the electrode fingers. However, the protective film 18 is not limited to this configuration.

The inventors of preferred embodiments of the present invention discovered that in an acoustic wave filter device in which the lithium tantalate film 14 is directly or indirectly stacked above the silicon support substrate 12, when the IDT electrode 15 is excited, in addition to the response of a main mode that is to be used, a plurality of spurious responses appear on the high-frequency side of the main mode. This plurality of spurious responses will be described with reference to FIG. 5.

Figure 5:
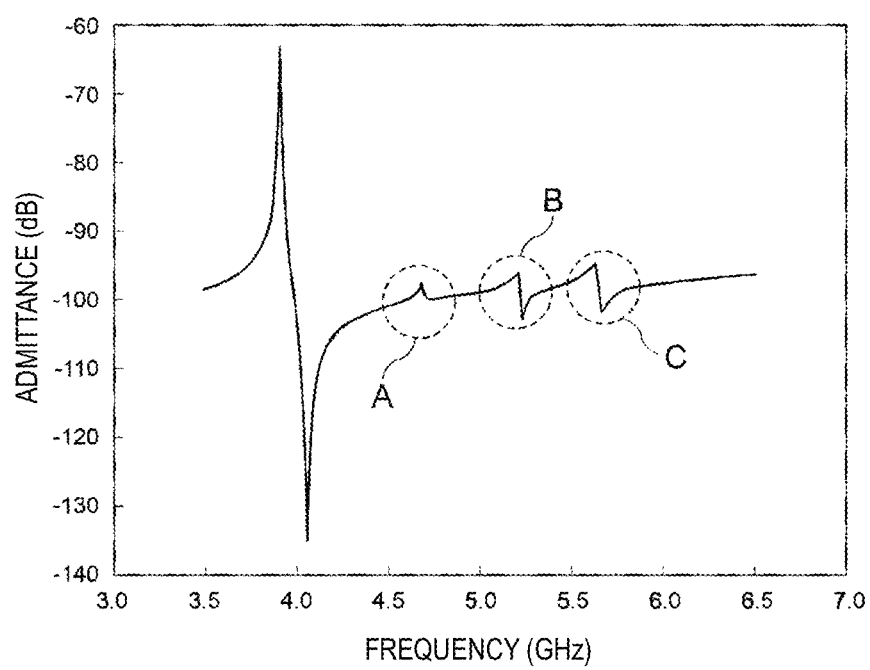
FIG. 5 is a diagram illustrating an admittance characteristic of the acoustic wave resonator.

FIG. 5 is a diagram illustrating the admittance characteristic of an example of an acoustic wave resonator in which a silicon oxide film and a lithium tantalate film are stacked above a silicon support substrate. As is clear from FIG. 5, spurious response A, spurious response B, and spurious response C appear at higher frequency positions than the main mode response that appears around 3.9 GHz. Spurious response A appears around at around 4.7 GHz. Spurious response B appears at a higher point at around 5.2 GHz. Spurious response C appears around 5.7 GHz. When the frequency of spurious response A is f1, the frequency of spurious response B is f2, and the frequency of spurious response C is f3, f1<f2<f3. The frequencies of spurious response A, spurious response B, and spurious response C are the peak positions of the impedance phase characteristic of the waves of spurious response A, spurious response B, and spurious response C.

As described above, in an acoustic wave device in which a plurality of acoustic wave filters having different pass bands are connected to each other so as to define a common connection at the side near the antenna terminal, when a spurious response generated by an acoustic wave filter having a pass band at a lower frequency appears in the pass band of another acoustic wave filter having a pass band at a higher frequency, a ripple is generated. Therefore, it is preferable that at least one of spurious response A, spurious response B, and spurious response C does not appear in the pass bands of the second to fourth acoustic wave filters 4 to 6. It is preferable that two spurious responses out of spurious response A, spurious response B, and spurious response C do not appear in the pass bands of the second to fourth acoustic wave filters 4 to 6. For example, it is preferable that spurious response A and spurious response B, spurious response A and spurious response C, or spurious response B and spurious response C do not appear in the pass bands of the second to fourth acoustic wave filters 4 to 6. In addition, it is preferable that none of spurious response A, spurious response B, and spurious response C appear in the pass bands of the second to fourth acoustic wave filters 4 to 6.

In the acoustic wave device 1 of the present preferred embodiment it is preferable that spurious response A of at least one acoustic wave resonator included in the first acoustic wave filter 3 does not appear in the second to fourth pass bands illustrated in FIG. 4. Therefore, degradation of the filter characteristics of the second to fourth acoustic wave filters 4 to 6 is unlikely to occur.

This feature of the present preferred embodiment is detailed in i) below.

i) The values of a wavelength-normalized thickness $T_{LT}$ of the lithium tantalate film 14, an Euler angle $\theta_{LT}$ of the lithium tantalate film 14, a wavelength-normalized thickness $T_S$ of the silicon oxide film 13, a wavelength-normalized thickness $T_E$ of the IDT electrode 15 converted into a thickness of aluminum obtained as the product of the wavelength-normalized thickness of the IDT electrode 15 and a value obtained by dividing the density of the IDT electrode 15 by the density of aluminum, a wavelength-normalized thickness $T_P$ of the protective film 18 obtained as the product of a value obtained by dividing the density of the protective film 18 by the density of silicon oxide and a wavelength-normalized thickness obtained by normalizing the thickness of the protective film 18 using a wavelength λ, the propagation direction $\psi_{Si}$ in the silicon support substrate 12, and a wavelength-normalized thickness $T_{Si}$ of the silicon support substrate 12 are set so that a frequency $f_{h1\_t}^{(n)}$ of spurious response A determined by Formula (1) and Formula (2) below satisfies Formula (3) or Formula (4) below for all values of m where m>n.

As a result, spurious response A is positioned outside the pass bands of the second to fourth acoustic wave filters 4 to 6. Therefore, degradation of the filter characteristics of the second to fourth acoustic wave filters 4 to 6 caused by spurious response A is unlikely to occur. Positioning of the frequency of spurious response A outside the second to fourth pass bands by satisfying the above conditions will be described in more detail below.

The density of the IDT electrode 15 is not a measured value, but rather a value obtained from the density of the metal material of the IDT electrode 15. In addition, the density of aluminum is 2698.9 kg/m$^3$. This value is provided in Handbook of Chemistry, Pure Chemistry II, Revised Fourth Edition, edited by The Chemical Society of Japan, published by Maruzen (1993), p. 26.

The density of the protective film 18 is not a measured value, but rather a value obtained from the density of the material of the protective film 18. In addition, the density of silicon oxide is 2200 kg/m$^3$. This value is provided in Handbook of Chemistry, Applied Chemistry II, Materials, Revised Fourth Edition, edited by The Chemical Society of Japan, published by Maruzen (1993), p. 922.

In addition, "the thickness of the protective film 18" in this specification refers to the thickness of the protective film in portions located above the electrode fingers of the IDT electrode.

$$V_h = \begin{aligned}&\left(a_{T_{LT}}^{(3)}\left((T_{LT}-c_{T_{LT}})^3 - b_{T_{LT}}^{(3)}\right) + a_{T_{LT}}^{(2)}\left((T_{LT}-c_{T_{LT}})^2 - b_{T_{LT}}^{(2)}\right) + \right.\\&a_{T_{LT}}^{(1)}(T_{LT}-c_{T_{LT}}) + a_{T_S}^{(2)}\left((T_S-c_{T_S})^2 - b_{T_S}^{(2)}\right) + \\&a_{T_S}^{(1)}(T_S-c_{T_S}) + a_{T_E}^{(1)}(T_E-c_{T_E}) + a_{\psi_{Si}}^{(5)}\left((\psi_{Si}-c_{\psi_{Si}})^5 - b_{\psi_{Si}}^{(5)}\right) + \\&a_{\psi_{Si}}^{(4)}\left((\psi_{Si}-c_{\psi_{Si}})^4 - b_{\psi_{Si}}^{(4)}\right) + a_{\psi_{Si}}^{(3)}\left((\psi_{Si}-c_{\psi_{Si}})^3 - b_{\psi_{Si}}^{(3)}\right) + \\&a_{\psi_{Si}}^{(2)}\left((\psi_{Si}-c_{\psi_{Si}})^2 - b_{\psi_{Si}}^{(2)}\right) + a_{\psi_{si}}^{(1)}(\psi_{Si}-c_{\psi_{Si}}) + \\&a_{\theta_{LT}}^{(2)}\left((\theta_{LT}-c_{\theta_{LT}})^2 - b_{\theta_{LT}}^{(2)}\right) + a_{\theta_{LT}}^{(1)}(\theta_{LT}-c_{\theta_{LT}}) + \\&d_{T_{LT}T_S}(T_{LT}-c_{T_{LT}})(T_S-c_{T_S}) + d_{T_{LT}T_E}(T_{LT}-c_{T_{LT}})\\&(T_E-c_{T_E}) + d_{T_{LT}\psi_{Si}}(T_{LT}-c_{T_{LT}})(\psi_{Si}-c_{\psi_{Si}}) + e\Big)\\&\left(a_{T_P}T_P^3 + b_{T_P}T_P^2 + c_{T_P}T_P^2 + d_{T_P}\right)\end{aligned}$$

Formula (1)

$$f_{hs\_t}^{(n)} = \frac{V_{hs\_t}}{\lambda_t^{(n)}}$$ Formula (2)

$$f_{hs\_t}^{(n)} > f_u^{(m)}$$ Formula (3)

$$f_{hs\_t}^{(n)} < f_l^{(m)}$$ Formula (4)

s=1 in Formulas (2) to (4).

In Formulas (1) to (4), h represents spurious a response located at a higher frequency than the main mode, n represents the n-th filter, t represents the t-th element (resonator) of the nth filter, and m represents the m-th (m>n) filter. Furthermore, in this specification, "wavelength-normalized thickness" refers to a thickness obtained by normalizing a thickness using the wavelength of the IDT electrode. Here, "wavelength" refers to a wavelength $\lambda$ determined by the electrode finger pitch of the IDT electrode. Therefore, a "wavelength-normalized thickness" is a thickness obtained by normalizing the actual thickness by treating $\lambda$ as 1 and is a value obtained by dividing the actual thickness by $\lambda$. The wavelength $\lambda$ determined by the electrode finger pitch of the IDT electrode may be determined as the average value of the electrode finger pitch.

The inventors of preferred embodiments of the present invention discovered that the frequency position of spurious response A is affected by the various parameters described above.

Figure 6:
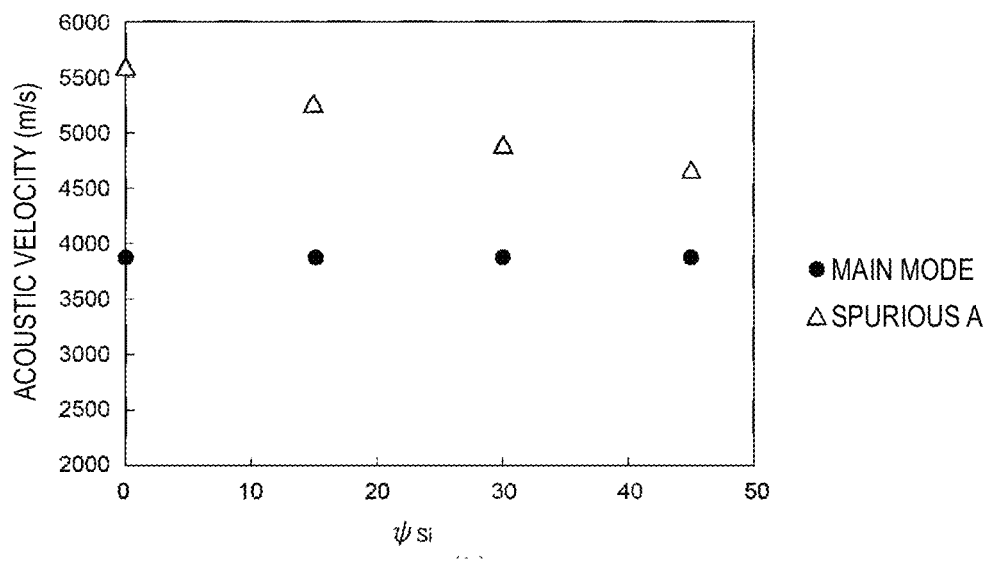
FIG. 6 is a diagram illustrating the relationship between a propagation direction $\psi_{Si}$ of a silicon support substrate and the acoustic velocities of waves of a main mode and a spurious response A.
Figure 7:
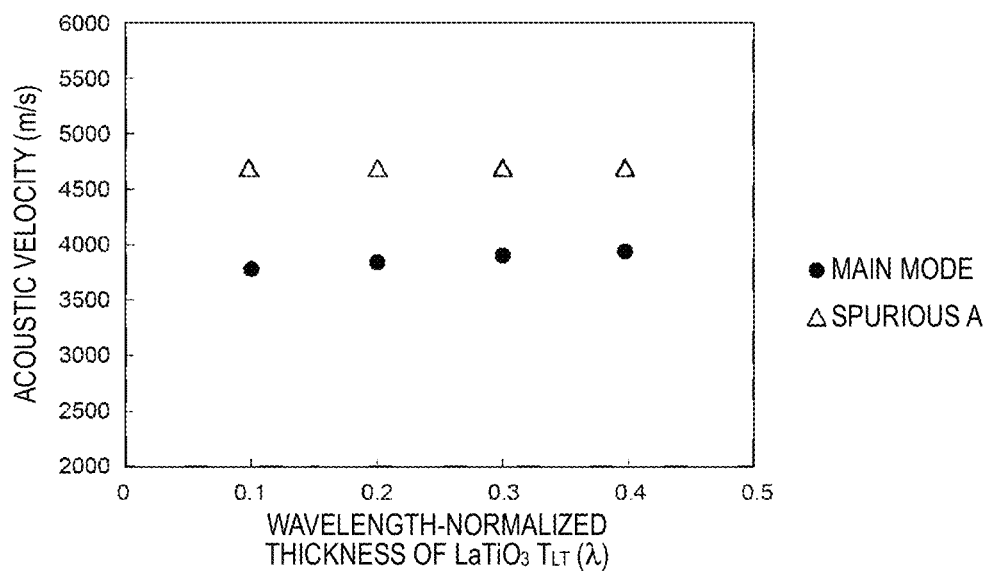
FIG. 7 is a diagram illustrating the relationship between the wavelength-normalized thickness of a lithium tantalate film and the acoustic velocities of waves of the main mode and the spurious response A.
Figure 8:
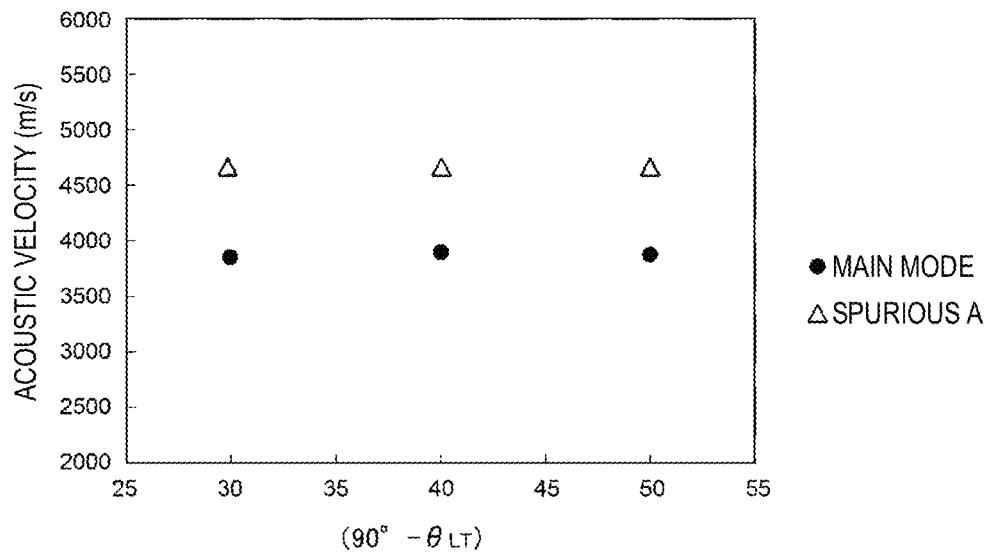
FIG. 8 is a diagram illustrating the relationship between the cut angle (about 90°−$\theta_{LT}$) of the lithium tantalate film and the acoustic velocities of waves of the main mode and the spurious response A.
Figure 9:
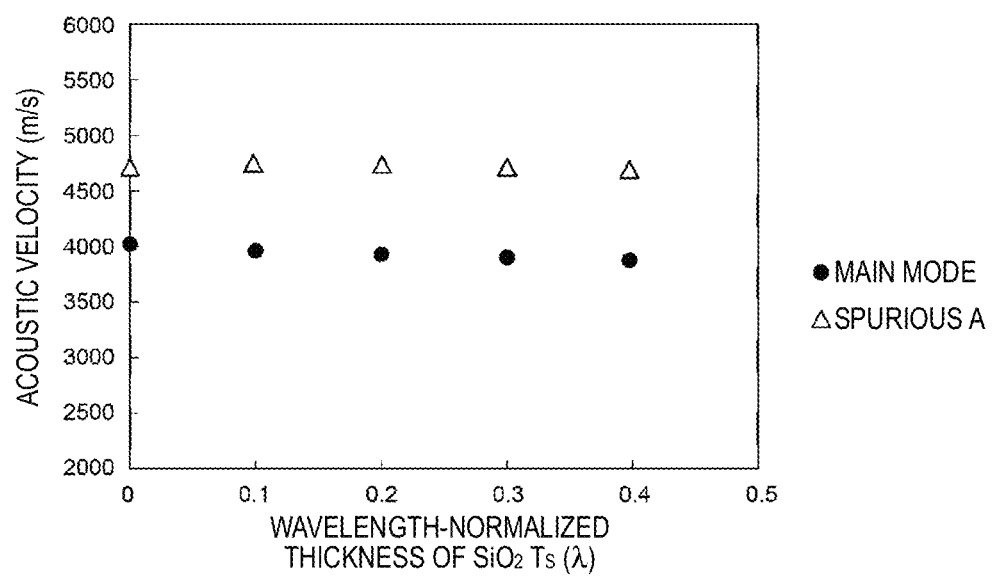
FIG. 9 is a diagram illustrating the relationship between the wavelength-normalized thickness of a silicon oxide film and the acoustic velocities of waves of the main mode and the spurious response A.
Figure 10:
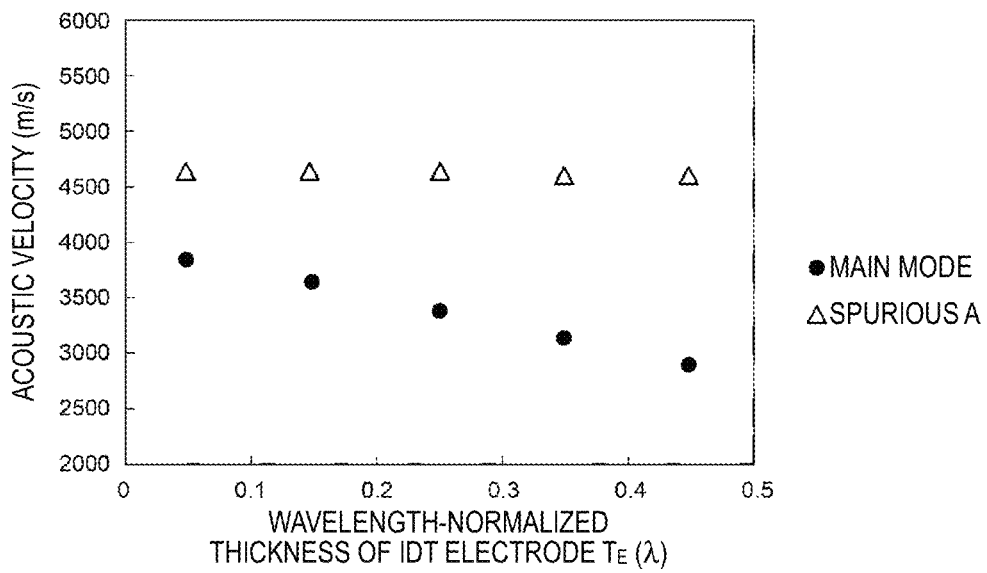
FIG. 10 is a diagram illustrating the relationship between the wavelength-normalized thickness of an IDT electrode and the acoustic velocities of waves of the main mode and the spurious response A.
Figure 11:
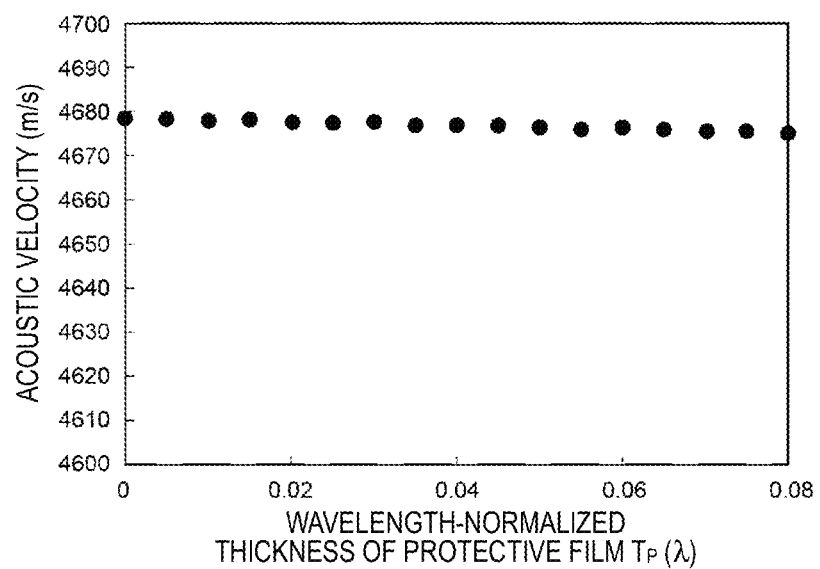
FIG. 11 is a diagram illustrating the relationship between the wavelength-normalized thickness of a protective film including a silicon oxide film and the acoustic velocity of waves of the spurious response A.

As illustrated in FIG. 6, the acoustic velocity of the main mode negligibly changes, whereas the acoustic velocity of the waves of spurious response A significantly changes when the propagation direction $\psi_{Si}$ of the silicon support substrate is changed. As illustrated in FIG. 7, the acoustic velocity of the waves of spurious response A changes with the wavelength-normalized thickness $T_{LT}$ of the lithium tantalate film. As illustrated in FIG. 8, the acoustic velocity of the waves of spurious response A also changes with the cut angle, i.e., (about 90°–$\theta_{LT}$), of the lithium tantalate film. As illustrated in FIG. 9, the acoustic velocity of the waves of spurious response A also slightly changes with the wavelength-normalized thickness $T_S$ of the silicon oxide film. As illustrated in FIG. 11, the acoustic velocity of the waves of spurious response A also changes with the wavelength-normalized thickness $T_P$ of the protective film, which is a silicon oxide film. In addition, as illustrated in FIG. 10, the acoustic velocity of the waves of spurious response A also slightly changes with the wavelength-normalized thickness $T_E$ of the IDT electrode. The inventors of preferred embodiments of the present invention obtained the acoustic velocity of the waves of spurious response A while freely changing these parameters. As a result, it was discovered that the acoustic velocity of waves of spurious response A is expressed by Formula (1). It was confirmed that the coefficients in Formula (1) preferably have the values listed in below Table 4 for the various crystal orientations of the silicon support substrate.

TABLE 4

| | s = 1 | | |
|---|---|---|---|
| | Si(100) | Si(110) | Si(111) |
| $a_{T_{LT}}^{(3)}$ | 0 | 0 | 0 |
| $a_{T_{LT}}^{(2)}$ | 0 | 0 | 0 |
| $a_{T_{LT}}^{(1)}$ | −436.3811104 | 0 | 0 |
| $b_{T_{LT}}^{(3)}$ | 0 | 0 | 0 |
| $b_{T_{LT}}^{(2)}$ | 0 | 0 | 0 |
| $c_{T_{LT}}$ | 0.251271186 | 0 | 0 |
| $a_{T_S}^{(2)}$ | 0 | 0 | 0 |
| $a_{T_S}^{(1)}$ | −370.8189665 | 0 | −174.7116877 |
| $b_{T_S}^{(2)}$ | 0 | 0 | 0 |
| $c_{T_S}$ | 0.250529661 | 0 | 0.24371308 |
| $a_{T_E}^{(1)}$ | 0 | 0 | 0 |
| $c_{T_E}$ | 0 | 0 | 0 |
| $a_{\psi_{Si}}^{(5)}$ | 0 | −6.73542E−06 | 0 |
| $a_{\psi_{Si}}^{(4)}$ | 0 | −4.84328E−05 | 0.000703463 |
| $a_{\psi_{Si}}^{(3)}$ | 0.044803063 | 0.020121569 | −4.77016E−05 |
| $a_{\psi_{Si}}^{(2)}$ | −0.11149637 | 0.237494527 | −0.961938987 |
| $a_{\psi_{Si}}^{(1)}$ | −43.37701861 | −1.22341255 | 0.091605753 |
| $b_{\psi_{Si}}^{(5)}$ | 0 | −78830.27657 | 0 |
| $b_{\psi_{Si}}^{(4)}$ | 0 | 1406271.562 | 340944.6167 |
| $b_{\psi_{Si}}^{(3)}$ | 51.32996847 | −17.77613547 | −41.61537323 |
| $b_{\psi_{Si}}^{(2)}$ | 280.2660593 | 895.2921635 | 446.7591732 |
| $c_{\psi_{Si}}$ | 22.32521186 | 45.02689779 | 30.11392405 |
| $a_{\theta_{LT}}^{(2)}$ | 0 | 0 | 0 |
| $a_{\theta_{LT}}^{(1)}$ | 0 | 0 | 0 |
| $b_{\theta_{LT}}^{(2)}$ | 0 | 0 | 0 |
| $c_{\theta_{LT}}$ | −90 | −90 | 90 |
| $d_{T_{LT}T_S}$ | 0 | 0 | 0 |

TABLE 4-continued

| | s = 1 | | |
| --- | --- | --- | --- |
| | Si(100) | Si(110) | Si(111) |
| $d_{TLTTE}$ | 0 | 0 | 0 |
| $d_{TLT\psi Si}$ | 0 | 0 | 0 |
| e | 5141.869703 | 5073.066348 | 4781.489451 |
| $a_{TP}$ | 0 | 0 | 0 |
| $b_{TP}$ | 0.02 | 0.02 | 0.02 |
| $c_{TP}$ | −0.0102 | −0.0102 | −0.0102 |
| $d_{TP}$ | 1.0002 | 1.0002 | 1.0002 |

When $V_{h1\_t}$ represent the acoustic velocity of waves of spurious A, the frequency of spurious A is expressed as $f_{h1\_t}^{(n)} = V_{h1\_t}/\lambda_t^{(n)}$ according to Formula (2). Here, $f_{h1}$ represents the frequency of spurious response A and t represents the number of an element, such as a resonator of the n-th filter.

In the present preferred embodiment, $f_{h1\_t}^{(n)}$ is higher than $f_u^{(m)}$ or lower than $f_l^{(m)}$, as illustrated in Formula (3) or Formula (4). In other words, $f_{h1\_t}^{(n)}$ is lower than the low-frequency ends or higher than the high-frequency ends of the second pass band, the third pass band, and the fourth pass band illustrated in FIG. 4. Therefore, it is clear that the frequency $f_{h1\_t}^{(n)}$ of spurious response A is not located inside the second to fourth pass bands.

In Formula (1), a) in the case where Si(100) (Euler angles ($\varphi_{Si}=0\pm5°$, $\theta_{Si}=0\pm5°$, $\psi_{Si}$)) is used, the range of $\psi_{Si}$ is about $0°\leq\psi_{Si}$ about 45°. However, due to the symmetry of the crystal structure of Si(100), $\psi_{Si}$ and $\psi_{Si}\pm(n\times90°)$ are synonymous (n=1, 2, 3 ... ). Similarly, $\psi_{Si}$ and $-\psi_{Si}$ have the same meaning.

(b) In the case where Si(110) (Euler angles ($\varphi_{Si}=-45\pm5°$, $\theta_{Si}=-90\pm5°$, $\psi_{Si}$)) is used, the range of $\psi_{Si}$ is about $0°\psi_{Si}\leq$about 90°. Due to the symmetry of the crystal structure of Si(110), $\psi_{Si}$ and $\psi_{Si}\pm(n\times180°)$ are synonymous (n=1, 2, 3 ... ). Similarly, $\psi_{Si}$ and $-\psi_{Si}$ have the same meaning.

(c) In the case where Si(111) (Euler angles ($\varphi_{Si}=-45\pm5°$, $\theta_{Si}=-54.73561\pm5°$, $\psi_{Si}$)) is used, the range of $\psi_{Si}$ is about $0°<\psi_{Si}$ about 60°. However, due to the symmetry of the crystal structure of Si(111), $\psi_{Si}$ and $\psi_{Si}\pm(n\times120°)$ are synonymous (n=1, 2, 3 ... ).

In addition, although the range of $\theta_{LT}$ is about $-180°<\theta_{LT}\leq$about 0°, $\theta_{LT}$ and $\theta_{LT}$ 180° may be treated as being synonymous.

In this specification, in Euler angles (0°±5°, θ, 0°±15°), "0°±5°" means within a range greater than or equal to −5° and less than or equal to +5° and "0°±15°" means within a range greater than or equal to −15° and less than or equal to +15°. In this specification, for example, a range within 0°±5° may be simply referred to as 0°±5°.

The wavelength-normalized thickness $T_E$ of the IDT electrode 15 is a thickness converted into a film thickness of an IDT electrode made of aluminum. However, the electrode material is not limited to Al. Various metals such as, for example, Ti, NiCr, Cu, Pt, Au, Mo, and W may be used. In addition, alloys including these metals as main components may be used. Furthermore, a multilayer metal film obtained by stacking a plurality of metal films made of such metals or alloys may be used.

Figure 12A:
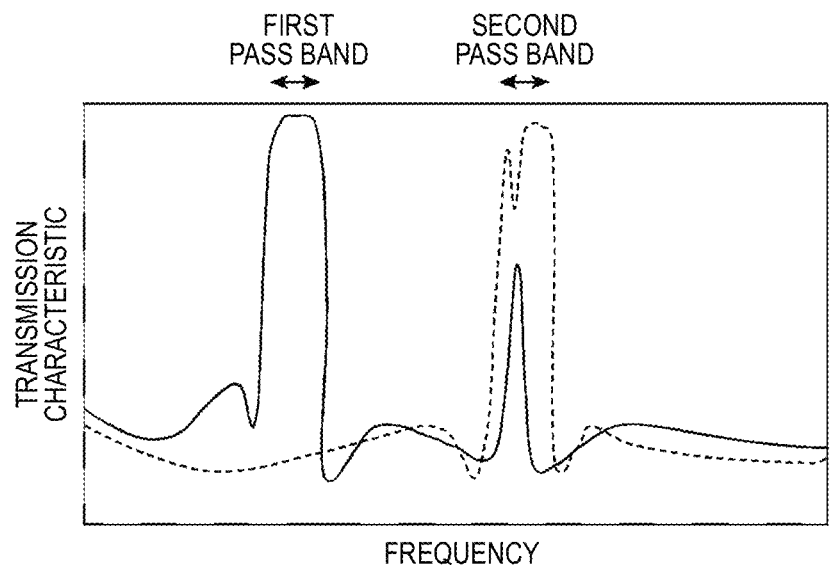
FIG. 12A is a diagram illustrating the filter characteristics of an acoustic wave device of a comparative example and FIG. 12B is a diagram illustrating the filter characteristics of the acoustic wave device of the first preferred embodiment of the present invention.
Figure 12B:
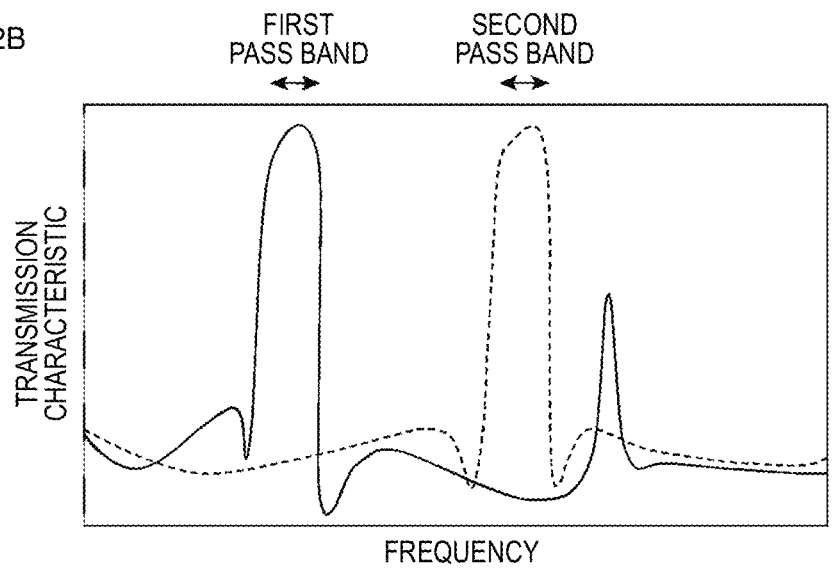

FIG. 12A is a diagram illustrating the filter characteristics of an acoustic wave device of a comparative example in which the acoustic wave resonator does not satisfy Formula (3) and Formula (4), and FIG. 12B is a diagram illustrating the filter characteristics of the acoustic wave device of the first preferred embodiment.

In FIGS. 12A and 12B, the filter characteristics of the first acoustic wave filter and the second acoustic wave filter are illustrated. The solid line represents the filter characteristics of the first acoustic wave filter. As illustrated by the broken line in FIG. 12A, a ripple appears in the pass band in the filter characteristics of the second acoustic wave filter. This is ripple is caused by a spurious response of an acoustic wave resonator inside the first acoustic wave filter. In contrast, as illustrated in FIG. 12B, in the acoustic wave device of the first preferred embodiment, this ripple does not appear in the pass band of the second acoustic wave filter. In other words, as a result of the acoustic wave resonator being configured to satisfy Formula (3) or Formula (4), the ripple does not appear in the second pass band of the second acoustic wave filter.

Figure 13:
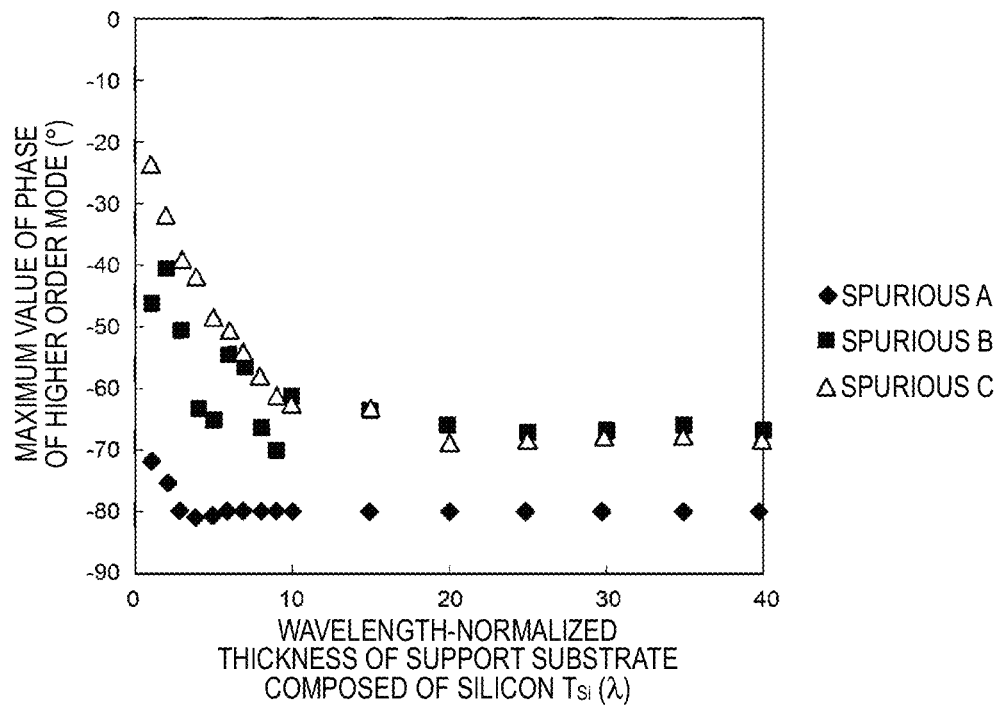
FIG. 13 is a diagram illustrating the relationship between the wavelength-normalized thickness of the silicon support substrate and the maximum values of the phases of spurious response A, spurious response B, and spurious response C.

FIG. 13 is a diagram illustrating the relationship between the wavelength-normalized thickness of the silicon support substrate and the maximum values of the phases of spurious response A, spurious response B, and spurious response C. As is clear from FIG. 13, when the wavelength-normalized thickness of the silicon support substrate is greater than about 4, the magnitude of spurious response A is almost constant and it is clear that variations in the wavelength-normalized thickness of the silicon support substrate are easily tolerated. When the wavelength-normalized thickness of the silicon support substrate is greater than about 10, spurious response B and spurious response C are constant and when the wavelength-normalized thickness of the silicon support substrate is greater than about 20, spurious response A, spurious response B, and spurious response C are all constant. Therefore, the wavelength-normalized thickness $T_{Si}$ of the silicon support substrate is preferably $T_{Si}>$about 4. The wavelength-normalized thickness $T_{Si}$ of the silicon support substrate is more preferably $T_{Si}>$about 10. The wavelength-normalized thickness $T_{Si}$ of the silicon support substrate is even more preferably $T_{Si}>$about 20.

In the present preferred embodiment, the frequency of spurious response A of at least one acoustic wave resonator among the plurality of acoustic wave resonators of the first acoustic wave filter 3 satisfies Formula (3) or Formula (4). More preferably, it is preferable the frequency of spurious response A of an acoustic wave resonator that is closest to the antenna terminal satisfy Formula (3) or Formula (4). This is because the effect of spurious response A of the acoustic wave resonator that is closest to the antenna terminal tends to appear more significantly in the pass bands of the other second to fourth acoustic wave filters 4 to 6 compared with the other acoustic wave resonators.

More preferably, it is preferable that the frequency position of spurious response A satisfy Formula (3) or Formula (4) in all of the acoustic wave resonators. As a result, it is even more unlikely that a ripple caused by spurious response A will be generated in the pass bands of the second to fourth acoustic wave filters 4 to 6.

With the structure of the present preferred embodiment of the present invention, as described above, the waves of spurious response A tend to be confined to the portion where the silicon oxide film 13 and the lithium tantalate film 14 are stacked, but when the wavelength-normalized thickness of the lithium tantalate film 14 is less than or equal to about 3.5, the portion where the silicon oxide film 13 and the lithium tantalate film 14 are stacked becomes thinner, and therefore the waves of spurious response A are less likely to be confined.

More preferably, the wavelength-normalized thickness of the lithium tantalate film 14 is less than or equal to about 2.5, for example, and in this case, the absolute value of a temperature coefficient of frequency TCF can be made smaller. In addition, the wavelength-normalized thickness of the lithium tantalate film 14 is preferably less than or equal to about 1.5, for example. In this case, the electromechanical coupling coefficient can be easily adjusted. In addition, more preferably, the wavelength-normalized thickness of the lithium tantalate film 14 is less than or equal to about 0.5, for example. In this case, the electromechanical coupling coefficient can be easily adjusted over a wide range.

Second Preferred Embodiment

In a second preferred embodiment of the present invention, a ripple caused by spurious response B rather than spurious response A is not located in the pass bands of the second to fourth acoustic wave filters 4 to 6. This will be explained with reference to FIGS. 14 to 19.

Figure 14:
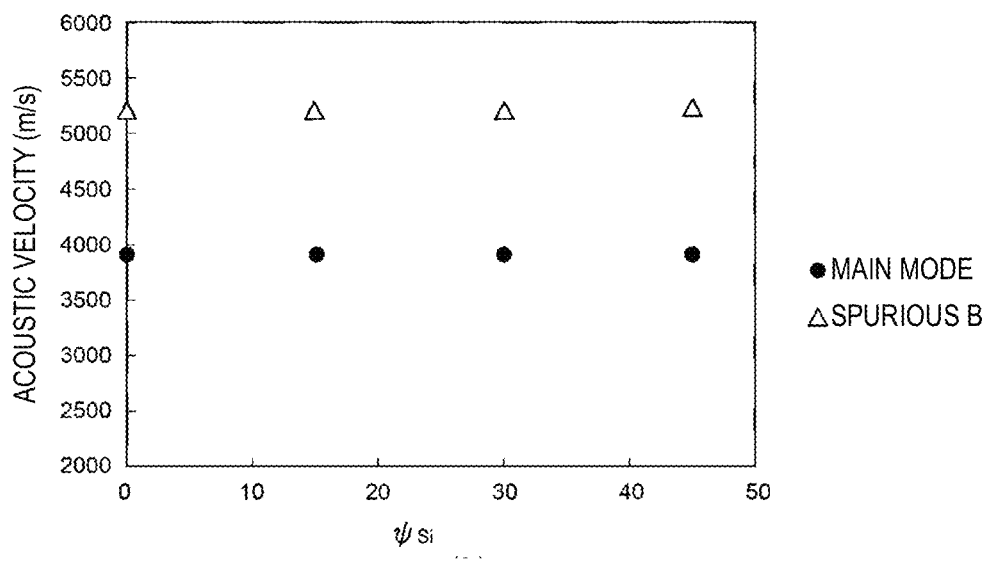
FIG. 14 is a diagram illustrating the relationship between a propagation direction $\psi_{Si}$ of the silicon support substrate and the acoustic velocities of waves of the main mode and the spurious response B.
Figure 15:
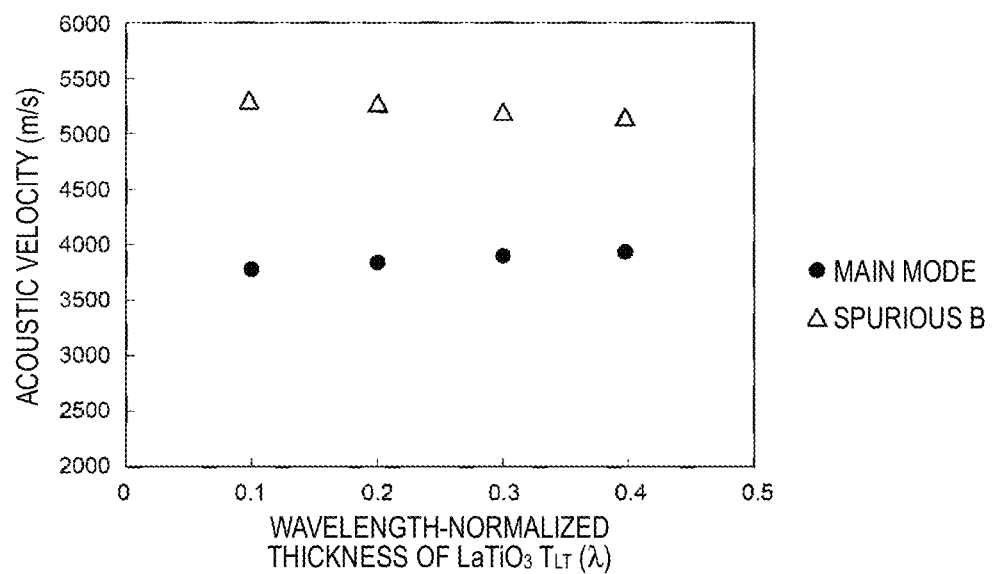
FIG. 15 is a diagram illustrating the relationship between the wavelength-normalized thickness of a lithium tantalate film and the acoustic velocities of waves of the main mode and the spurious response B.
Figure 16:
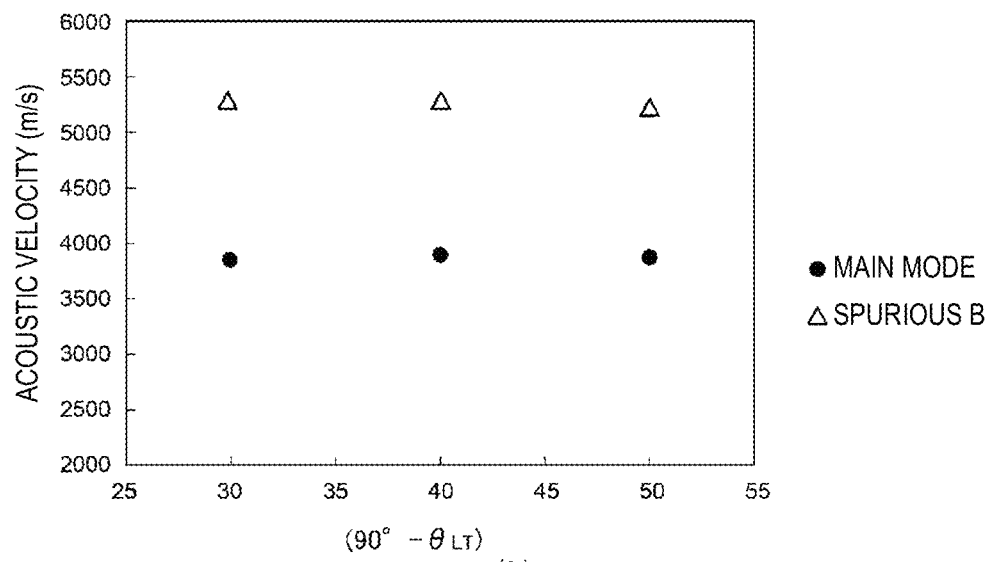
FIG. 16 is a diagram illustrating the relationship between the cut angle (about 90°−$\theta_{LT}$) of the lithium tantalate film and the acoustic velocities of waves of the main mode and the spurious response B.
Figure 17:
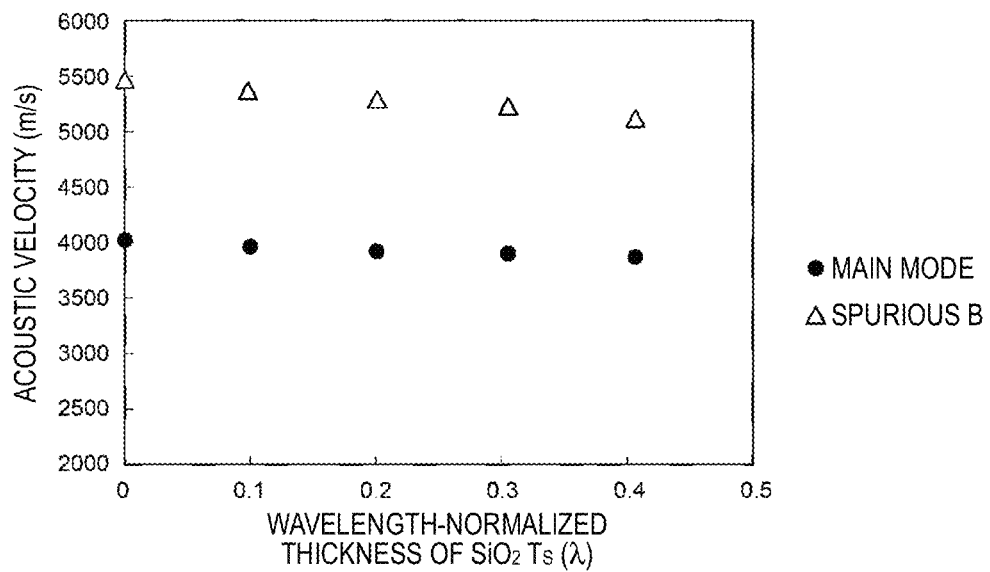
FIG. 17 is a diagram illustrating the relationship between the wavelength-normalized thickness of a silicon oxide film and the acoustic velocities of waves of the main mode and the spurious response B.
Figure 18:
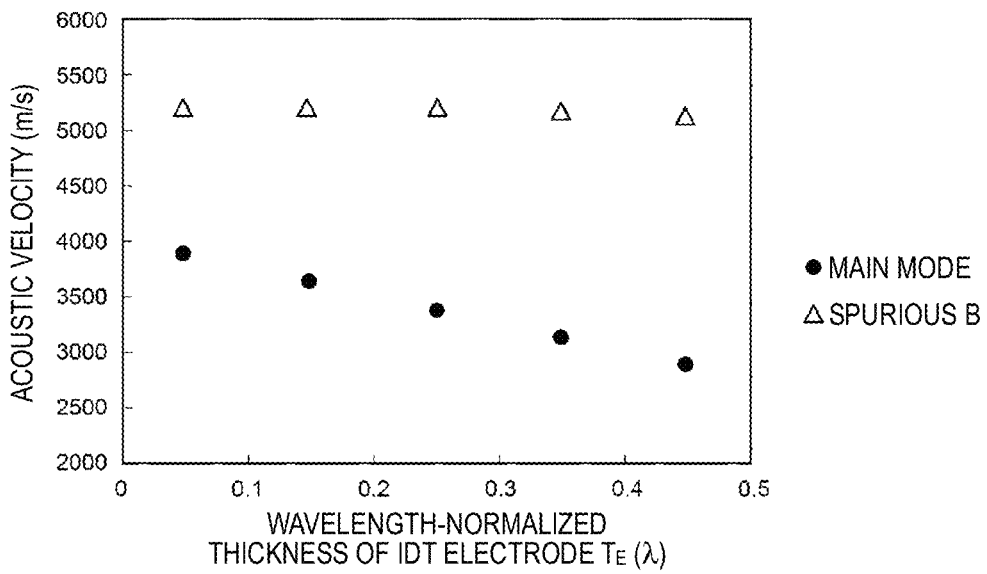
FIG. 18 is a diagram illustrating the relationship between the wavelength-normalized thickness of the IDT electrode and the acoustic velocities of waves of the main mode and the spurious response B.
Figure 19:
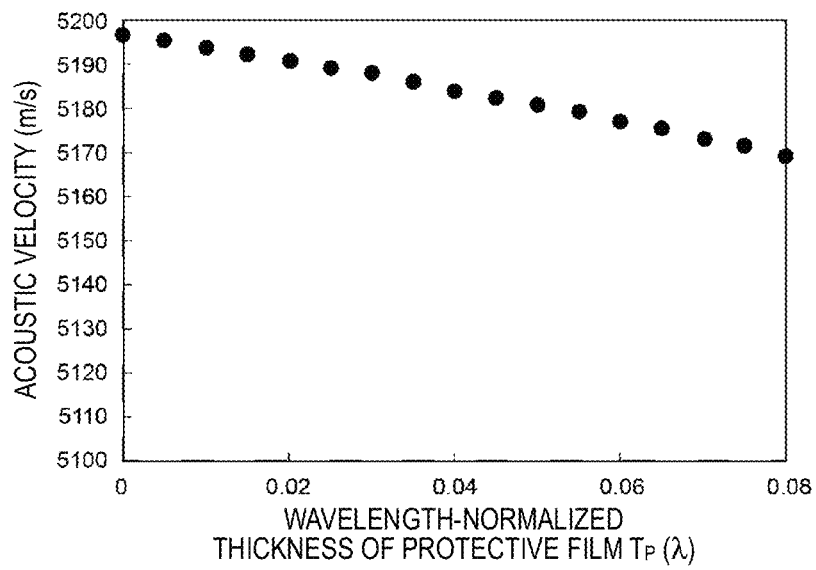
FIG. 19 is a diagram illustrating the relationship between the wavelength-normalized thickness of a protective film including a silicon oxide film and the acoustic velocity of waves of the spurious response B.

As illustrated in FIG. 14, the acoustic velocity of the waves of spurious response B changes with the propagation direction $\psi_{Si}$. Similarly, as illustrated in FIG. 15, the acoustic velocity of the waves of spurious response B also changes with the wavelength-normalized thickness $T_{LT}$ of the lithium tantalate film. As illustrated in FIG. 16, the acoustic velocity of the waves of spurious response B also changes with the cut angle (about $90°-\theta_{LT}$) of the lithium tantalate film. As illustrated in FIG. 17, the acoustic velocity of the waves of spurious response B also changes with the wavelength-normalized thickness $T_S$ of the silicon oxide film. As illustrated in FIG. 18, the acoustic velocity of the waves of spurious response B also changes with the wavelength-normalized thickness $T_E$ of the IDT electrode. Furthermore, as illustrated in FIG. 19, it is clear that the acoustic velocity of the waves of spurious response B also changes with the wavelength-normalized thickness $T_P$ of the protective film, which is preferably a silicon oxide film, for example. From the results illustrated in FIGS. 14 to 19, it was discovered that the acoustic velocity of the waves of spurious response B is also expressed by Formula (1), similarly to the first preferred embodiment. However, the coefficients in Formula (1) preferably have the values listed in Table 5 below for the various crystal orientations of the silicon support substrate in the case of the waves of spurious B.

TABLE 5

| | s = 2 | | |
|---|---|---|---|
| | Si(100) | Si(110) | Si(111) |
| $a_{TLT}^{(3)}$ | 0 | 0 | 0 |
| $a_{TLT}^{(2)}$ | −3168.980655 | −3017.48047 | −6490.588929 |
| $a_{TLT}^{(1)}$ | −1070.770975 | −1740.800945 | −1736.124534 |
| $b_{TLT}^{(3)}$ | 0 | 0 | 0 |
| $b_{TLT}^{(2)}$ | 0.012520877 | 0.011673567 | 0.012932291 |
| $c_{TLT}$ | 0.25 | 0.26454918 | 0.244042365 |
| $a_{TS}^{(2)}$ | 0 | 0 | −5447.157686 |
| $a_{TS}^{(1)}$ | −1175.713239 | −1443.794269 | −1260.230106 |
| $b_{TS}^{(2)}$ | 0 | 0 | 0.012411464 |
| $c_{TS}$ | 0.250104384 | 0.264754098 | 0.243336275 |
| $a_{TE}^{(1)}$ | −440.9839549 | −631.5739347 | −613.3480905 |
| $c_{TE}$ | 0.249686848 | 0.254030055 | 0.249646955 |
| $a_{\psi Si}^{(5)}$ | 0 | 0 | 0 |
| $a_{\psi Si}^{(4)}$ | 0 | −8.39122E−05 | 0 |
| $a_{\psi Si}^{(3)}$ | −0.01385161 | −0.000219614 | 0 |
| $a_{\psi Si}^{(2)}$ | 0.040113138 | 0.288564318 | 0.113517332 |
| $a_{\psi Si}^{(1)}$ | 10.06827612 | −1.021332326 | 0.01604077 |
| $b_{\psi Si}^{(5)}$ | 0 | 0 | 0 |
| $b_{\psi Si}^{(4)}$ | 0 | 1489555.068 | 0 |
| $b_{\psi Si}^{(3)}$ | −14.09179662 | −1671.679914 | 0 |
| $b_{\psi Si}^{(2)}$ | 281.2490194 | 936.1444126 | 446.7377612 |
| $c_{\psi Si}$ | 22.53131524 | 46.09631148 | 29.70873786 |

TABLE 5-continued

| | s = 2 | | |
|---|---|---|---|
| | Si(100) | Si(110) | Si(111) |
| $a_{\theta LT}^{(2)}$ | 0 | 0 | 0 |
| $a_{\theta LT}^{(1)}$ | −2.926997767 | 0 | 0 |
| $b_{\theta LT}^{(2)}$ | 0 | 0 | 0 |
| $c_{\theta LT}$ | −50.02087683 | −90 | −90 |
| $d_{TLTTS}$ | 0 | 0 | 0 |
| $d_{TLTTE}$ | −2151.133017 | −2785.629029 | −2639.620065 |
| $d_{TLT\psi Si}$ | 17.13925013 | 0 | 0 |
| e | 5188.573706 | 5052.799929 | 5187.888817 |
| $a_{TP}$ | 0 | 0 | 0 |
| $b_{TP}$ | −0.1336 | −0.1336 | −0.1336 |
| $c_{TP}$ | −0.0552 | −0.0552 | −0.0552 |
| $d_{TP}$ | 1.001 | 1.001 | 1.001 |

The frequency position of spurious response B is obtained from the frequency position of spurious B $f_{h2\_t}^{(n)} = V_{h2\_t}/\lambda_t^{(n)}$ using Formula (2) from the obtained acoustic velocity $V_{h2\_t}$ of the waves of spurious response B, as described above. In addition, in the second preferred embodiment, the frequency position $f_{h2\_t}^{(n)}$ of spurious response B is set so that the frequency position of spurious response B satisfies Formula (3A) or Formula (4A) below. Therefore, in the second preferred embodiment, spurious response B is located outside the second to fourth pass bands of the second to fourth acoustic wave filters 4 to 6. Therefore, ripples are unlikely to be generated in the filter characteristics of the second to fourth acoustic wave filters 4 to 6 due to spurious response B.

$$f_{h2\_t}^{(n)} > f_u^{(m)} \qquad \text{Formula (3A)}$$

$$f_{h2\_t}^{(n)} < f_l^{(m)} \qquad \text{Formula (4A)}$$

More preferably, the frequency position of spurious response B satisfy Formula (3A) or Formula (4A) in all of the acoustic wave resonators. As a result, it is even more unlikely that a ripple caused by spurious response B will be generated in the pass bands of the second to fourth acoustic wave filters 4 to 6. However, it is sufficient that the frequency position of spurious response B satisfy Formula (3A) or Formula (4A) in at least one acoustic wave resonator of the first acoustic wave filter 3.

Third Preferred Embodiment

In a third preferred embodiment of the present invention, a ripple caused by spurious response C rather than spurious response A is not located in the pass bands of the second to fourth acoustic wave filters 4 to 6. This will be explained with reference to FIGS. 20 to 25.

Figure 20:
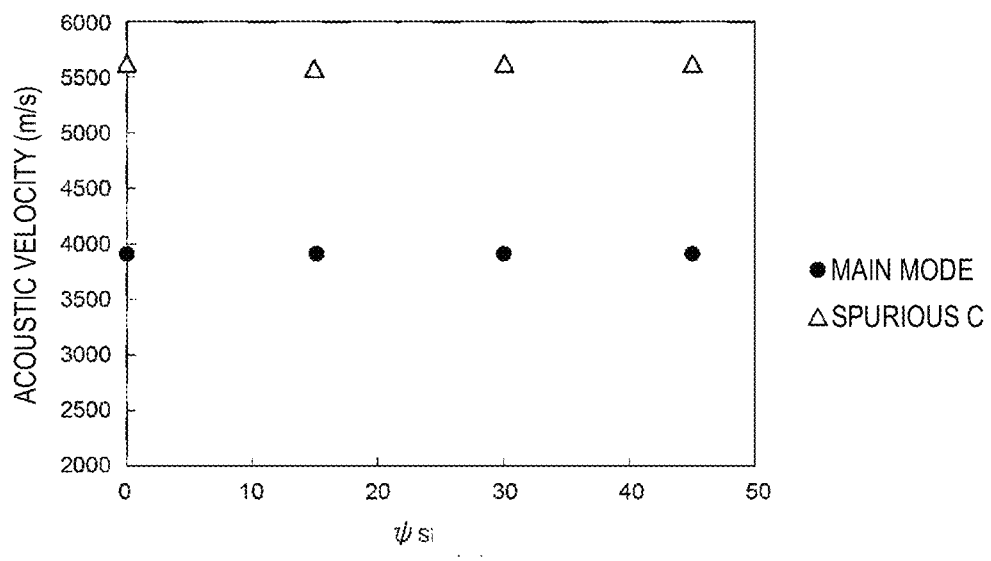
FIG. 20 is a diagram illustrating the relationship between the propagation direction $\psi_{Si}$ of the silicon support substrate and the acoustic velocities of waves of the main mode and the spurious response C.
Figure 21:
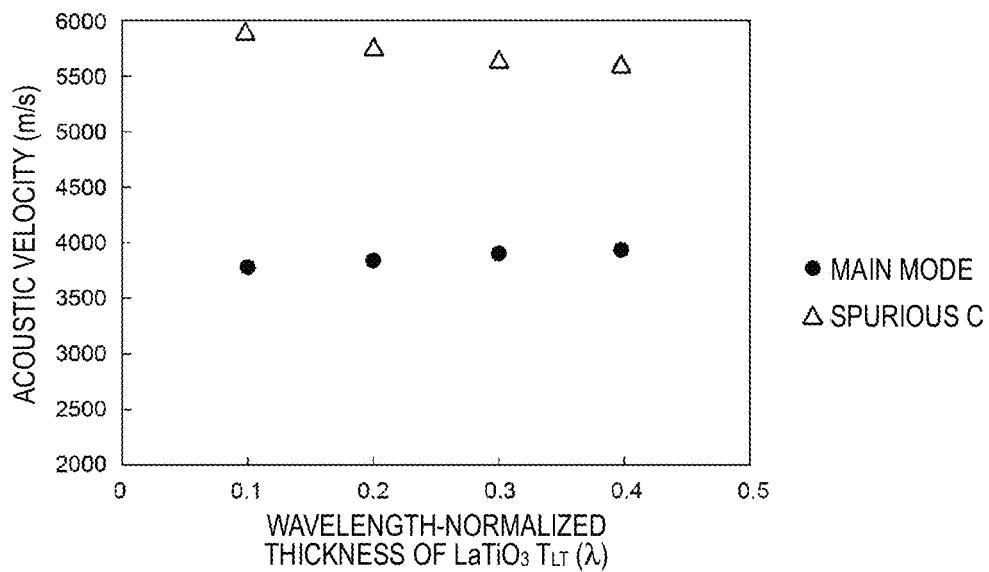
FIG. 21 is a diagram illustrating the relationship between the wavelength-normalized thickness of the lithium tantalate film and the acoustic velocities of waves of the main mode and the spurious response C.
Figure 22:
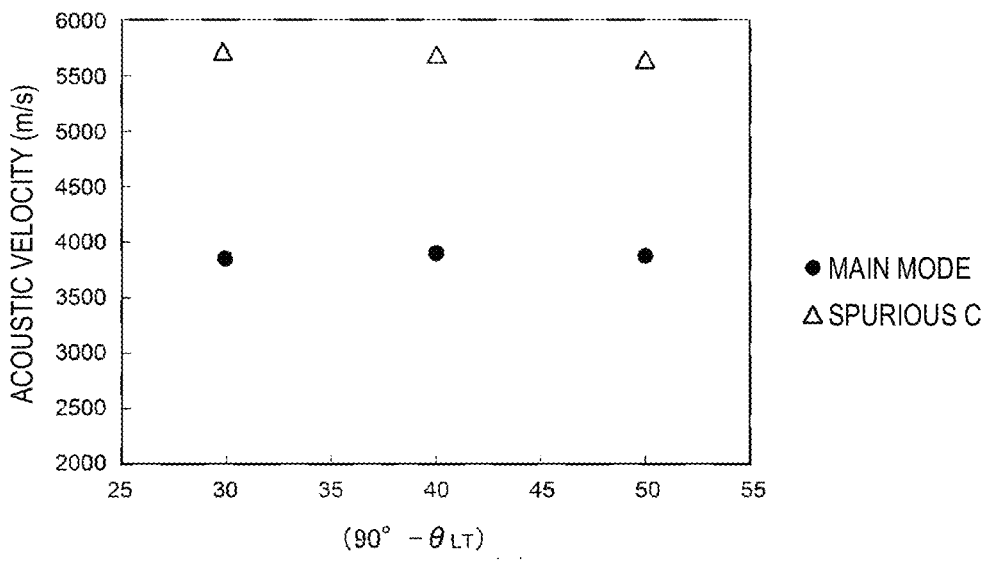
FIG. 22 is a diagram illustrating the relationship between the cut angle (about 90°−$\theta_{LT}$) of the lithium tantalate film and the acoustic velocities of waves of the main mode and the spurious response C.
Figure 23:
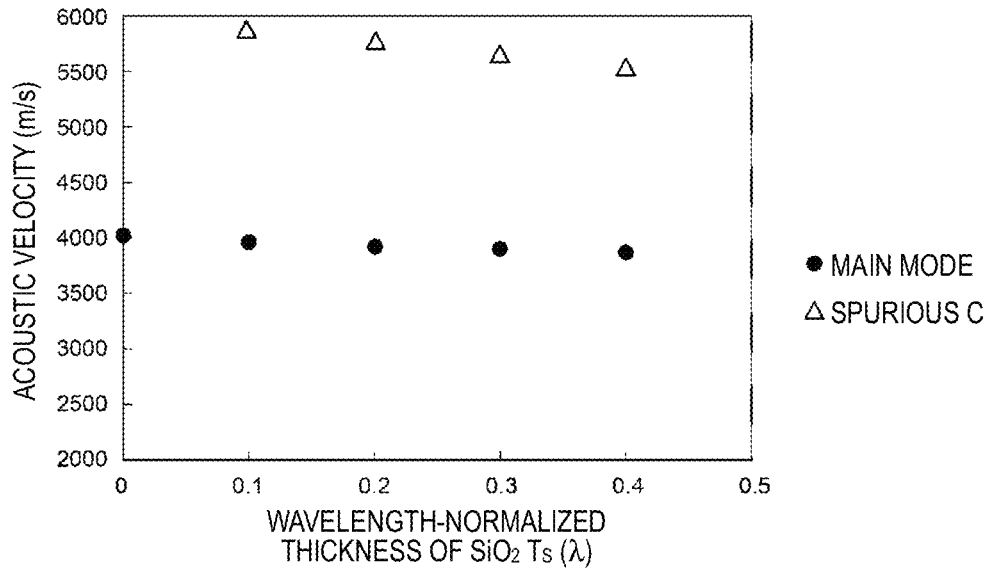
FIG. 23 is a diagram illustrating the relationship between the wavelength-normalized thickness of the silicon oxide film and the acoustic velocities of waves of the main mode and spurious C.
Figure 24:
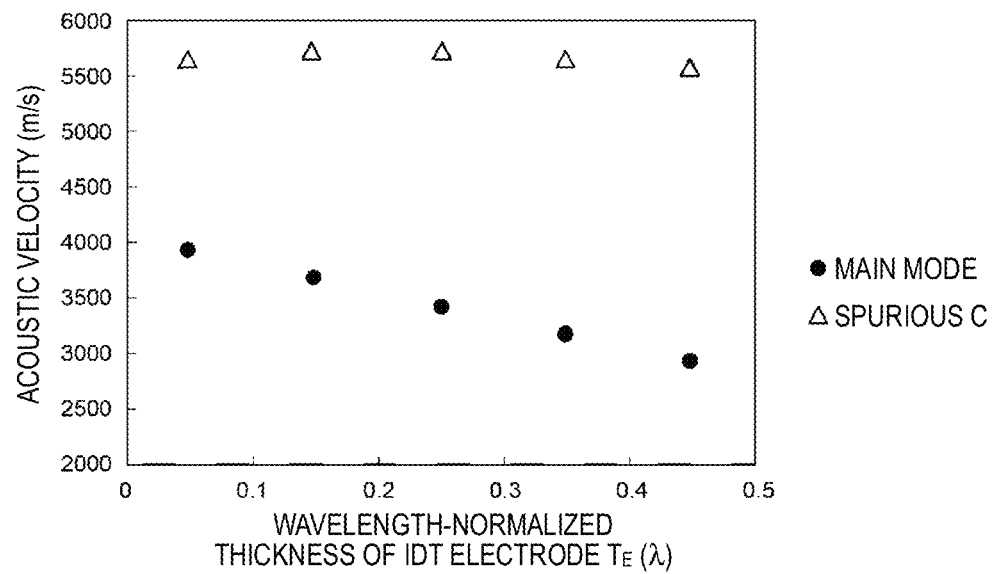
FIG. 24 is a diagram illustrating the relationship between the wavelength-normalized thickness of the IDT electrode and the acoustic velocities of waves of the main mode and the spurious response C.
Figure 25:
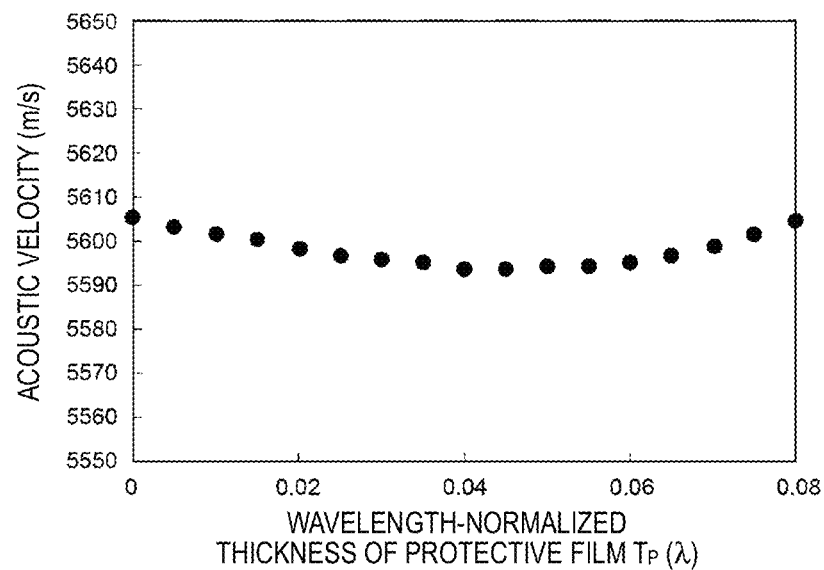
FIG. 25 is a diagram illustrating the relationship between the wavelength-normalized thickness of the protective film including a silicon oxide film and the acoustic velocity of waves of the spurious response C.

As illustrated in FIG. 20, the acoustic velocity of the waves of spurious response C changes with the propagation direction $\psi_{Si}$. Similarly, as illustrated in FIG. 21, the acoustic velocity of the waves of spurious response C also changes with the wavelength-normalized thickness $T_{LT}$ of the lithium tantalate film. As illustrated in FIG. 22, the acoustic velocity of the waves of spurious response C also changes with the cut angle (about $90°-\theta_{LT}$) of the lithium tantalate film. As illustrated in FIG. 23, the acoustic velocity of the waves of spurious response C also changes with the wavelength-normalized thickness $T_S$ of the silicon oxide film. As illustrated in FIG. 24, the acoustic velocity of the waves of spurious response C also changes with the wavelength-normalized thickness $T_E$ of the IDT electrode. In addition, as illustrated in FIG. 25, the acoustic velocity of the waves of spurious response C also changes with the wavelength-normalized thickness $T_P$ of the protective film, which is preferably a silicon oxide film, for example. From the results illustrated in FIGS. 20 to 25, it was discovered that the acoustic velocity of the waves of spurious response C is also expressed by Formula (1), similarly to as in the case of the first preferred embodiment. However, the coefficients in Formula (1) preferably have the values listed in below Table 6 for the various crystal orientations of the silicon support substrate in the case of the waves of spurious response C.

TABLE 6

| | s = 3 | | |
|---|---|---|---|
| | Si(100) | Si(110) | Si(111) |
| $a_{TLT}^{(3)}$ | 24973.69604 | 0 | 0 |
| $a_{TLT}^{(2)}$ | 1430.312613 | 0 | −6156.310187 |
| $a_{TLT}^{(1)}$ | −1027.290569 | −737.4915071 | −1476.525631 |
| $b_{TLT}^{(3)}$ | −0.000364885 | 0 | 0 |
| $b_{TLT}^{(2)}$ | 0.011041041 | 0 | 0.009760415 |
| $c_{TLT}$ | 0.277376171 | 0.283128295 | 0.290986602 |
| $a_{TS}^{(2)}$ | 0 | 0 | 0 |
| $a_{TS}^{(1)}$ | −617.9601012 | 0 | 0 |
| $b_{TS}^{(2)}$ | 0 | 0 | 0 |
| $c_{TS}$ | 0.273226238 | 0 | 0 |
| $a_{TE}^{(1)}$ | −254.6645301 | −400.406917 | −524.8090015 |
| $c_{TE}$ | 0.262449799 | 0.265026362 | 0.25499391 |
| $a_{\psi Si}^{(5)}$ | 0 | 0 | 0 |
| $a_{\psi Si}^{(4)}$ | 0 | −0.000208283 | −0.000637441 |
| $a_{\psi Si}^{(3)}$ | 0 | −0.004709453 | −0.001817349 |
| $a_{\psi Si}^{(2)}$ | −0.126294383 | 0.574442977 | 0.749991624 |
| $a_{\psi Si}^{(1)}$ | 2.746835794 | 7.891650217 | −0.116425099 |
| $b_{\psi Si}^{(5)}$ | 0 | 0 | 0 |
| $b_{\psi Si}^{(4)}$ | 0 | 1654327.754 | 303345.3736 |
| $b_{\psi Si}^{(3)}$ | 0 | −7229.860818 | −201.8986483 |
| $b_{\psi Si}^{(2)}$ | 266.9400494 | 985.3381236 | 411.1815157 |
| $c_{\psi Si}$ | 22.10843373 | 47.8602812 | 30.42021924 |
| $a_{\theta LT}^{(2)}$ | 0 | 0 | 0.593925697 |
| $a_{\theta LT}^{(1)}$ | 0 | 0 | −2.75182308 |
| $b_{\theta LT}^{(2)}$ | 0 | 0 | 67.60597649 |
| $c_{\theta LT}$ | −90 | −90 | −49.6589525 |
| $d_{TLTTS}$ | −2391.060714 | 0 | 0 |
| $d_{TLTTE}$ | 0 | 0 | −2773.934251 |
| $d_{TLT\psi Si}$ | −12.5134053 | 15.88055602 | 0 |
| e | 5661.675305 | 5417.174527 | 5440.57579 |
| $a_{TP}$ | 10.443 | 10.443 | 10.443 |
| $b_{TP}$ | −0.0316 | −0.0316 | −0.0316 |
| $c_{TP}$ | −0.0653 | −0.0653 | −0.0653 |
| $d_{TP}$ | 1.0011 | 1.0011 | 1.0011 |

The frequency position of spurious response C is obtained from the frequency position of spurious response C $f_{h3\_t}^{(n)}=V_{h3\_t}/\lambda t^{(n)}$ using Formula (2) from the obtained acoustic velocity $V_{h3\_t}$ of the waves of spurious response C, as described above. In the third preferred embodiment, the frequency position of spurious response C is set so that the frequency position of spurious response C satisfies Formula (3B) or Formula (4B) below. Therefore, in the third preferred embodiment, spurious response C is located outside the second to fourth pass bands of the second to fourth acoustic wave filters 4 to 6. Therefore, ripples caused by spurious response C are unlikely to be generated in the filter characteristics of the second to fourth acoustic wave filters 4 to 6.

$$f_{h3\_t}^{(n)} > f_u^{(m)} \quad \text{Formula (3B)}$$

$$f_{h3\_t}^{(n)} < f_l^{(m)} \quad \text{Formula (4B)}$$

More preferably, the frequency position of spurious response C satisfy Formula (3B) or Formula (4B) in all of the acoustic wave resonators. As a result, it is even more unlikely that a ripple caused by spurious response C will be generated in the pass bands of the second to fourth acoustic wave filters 4 to 6. However, it is sufficient that the frequency position of spurious response C satisfy Formula (3B) or Formula (4B) in at least one acoustic wave resonator of the first acoustic wave filter 3.

Fourth Preferred Embodiment

A fourth preferred embodiment of the present invention satisfies all of content of the first preferred embodiment, the second preferred embodiment, and the third preferred embodiment. The specific structure of an acoustic wave device of the fourth preferred embodiment is the same or substantially the same as that of the first to third preferred embodiments.

In the fourth preferred embodiment, the frequency positions of spurious response A, spurious response B, and spurious response C represented by Formula (2) are expressed as $f_{hs\_t}^{(n)}=V_{hs\_t}/\lambda_t^{(n)}$, where the acoustic velocities of the waves of spurious response A, spurious response B, and spurious response C are represented by $V_{h1\_t}$, $V_{h2\_t}$, and $V_{h3\_t}$, respectively. Here, s is 1, 2, or 3. In the fourth preferred embodiment, a first frequency $f_{h1\_t}^{(n)}$, which is the frequency of spurious response A, a second frequency $f_{h2\_t}^{(n)}$, which is the frequency of spurious response B, and a third frequency $f_{h3\_t}^{(n)}$, which is the frequency of spurious response C, are all higher than $f_u^{(m)}$ or lower than $f_l^{(m)}$. Therefore, spurious response A, spurious response B, and spurious response C are located outside the second to fourth pass bands of the second to fourth acoustic wave filters 4 to 6. Therefore, degradation of the filter characteristics of the second to fourth acoustic wave filters 4 to 6 is even less likely to occur.

Therefore, summarizing the conditions of the fourth preferred embodiment, $f_{hs\_t}^{(n)}$ (s is 1, 2, or 3) satisfies $f_{hs\_t}^{(n)} > f_u^{(m)}$ or $f_{hs\_t}^{(n)} < f_l^{(m)}$ when s is 1, 2, or 3. In the fourth preferred embodiment, it is preferable that $T_{Si} >$ about 20 in order that the magnitudes of spurious response A, spurious response B, and spurious response C can be maintained constant or substantially constant.

In the fourth preferred embodiment, spurious response A, spurious response B, and spurious response C are preferably not located in the pass bands of the second to fourth acoustic wave filters, which are the other acoustic wave filters, but two of spurious response A, spurious response B, and spurious response C, such as spurious response A and spurious response B, spurious response A and spurious response C, or spurious response B and spurious response C may be located outside the pass bands of the second to fourth acoustic wave filters. In this case, the effects of the spurious responses can be further reduced compared with the first to third preferred embodiments.

Figure 26:
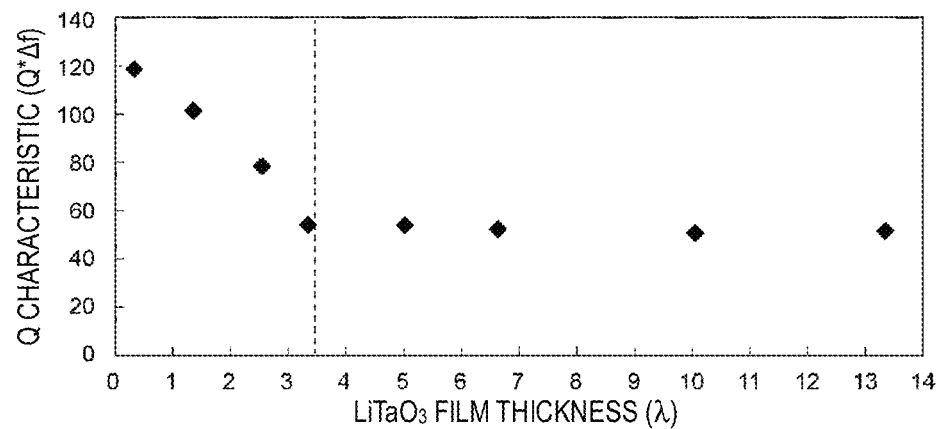
FIG. 26 is a diagram illustrating the relationship between the film thickness of a $LiTaO_3$ film and a Q value in an acoustic wave device.
Figure 27:
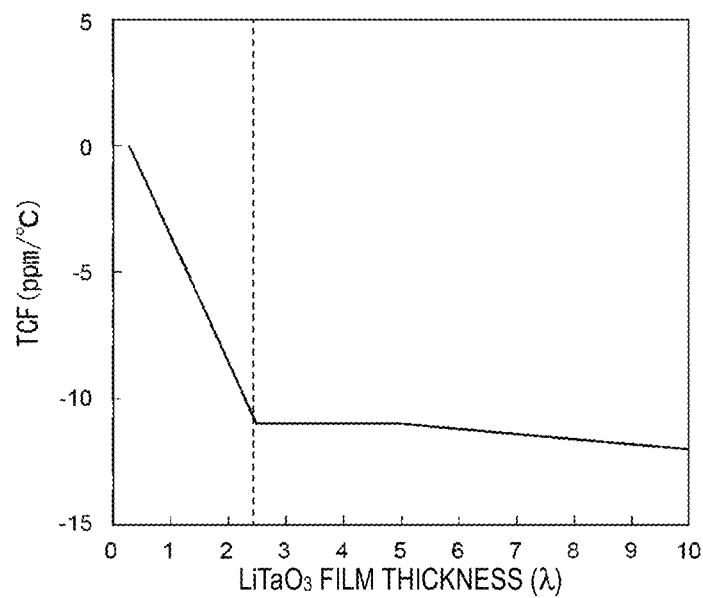
FIG. 27 is a diagram illustrating the relationship between the film thickness of a $LiTaO_3$ film and a temperature coefficient of frequency TCF in an acoustic wave device.
Figure 28:
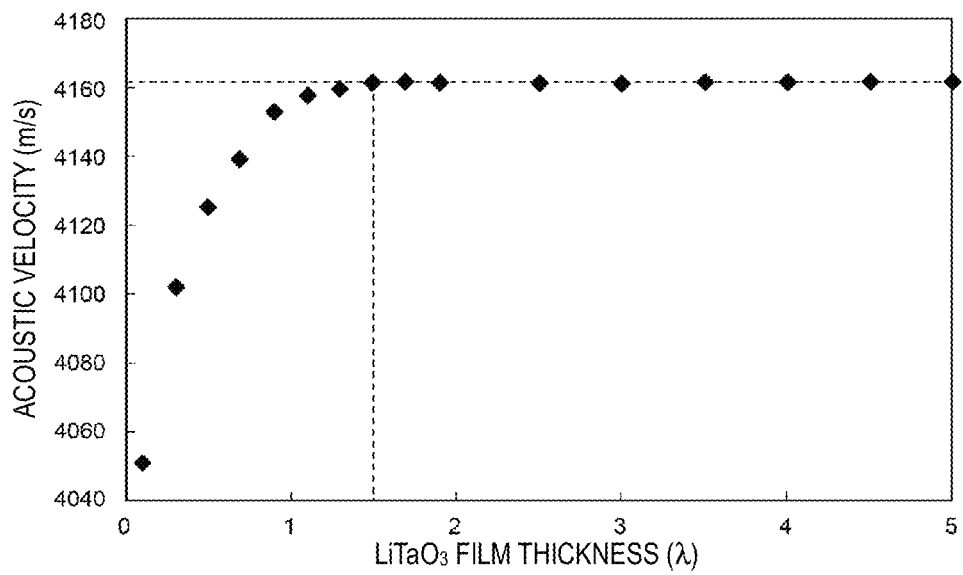
FIG. 28 is a diagram illustrating the relationship between the film thickness of a $LiTaO_3$ film and acoustic velocity in an acoustic wave device.

FIG. 26 is a diagram illustrating the relationship between the film thickness of a $LiTaO_3$ film and the Q value in an acoustic wave device in which a low-acoustic-velocity film including a $SiO_2$ film having a thickness of about 0.35λ and a $LiTaO_3$ film having Euler angles (0°, 140.0°, 0°) are stacked above a high-acoustic-velocity silicon support substrate. The vertical axis in FIG. 26 represents the product of a Q characteristic and a relative bandwidth (Δf) of a resonator. In addition, FIG. 27 is a diagram illustrating the relationship between the film thickness of a $LiTaO_3$ film and the temperature coefficient of frequency TCF. FIG. 28 is a diagram illustrating the relationship between the film thickness of a $LiTaO_3$ film and acoustic velocity. From FIG. 26, the film thickness of the $LiTaO_3$ film is preferably less than or equal to about 3.5λ, for example. In this case, the Q value is higher than in the case where the film thickness is greater than about 3.5λ. More preferably, the film thickness of the LiTaO₃ film is less than or equal to about 2.5λ, for example, in order to further increase the Q value.

Furthermore, from FIG. 27, in the case where the film thickness of the LiTaO₃ film is less than or equal to about 2.5λ, the absolute value of the temperature coefficient of frequency TCF can be reduced compared with the case where the film thickness is greater than about 2.5λ. More preferably, the film thickness of the LiTaO₃ film is less than or equal to about 2λ, for example, and in this case, the absolute value of the temperature coefficient of frequency TCF is less than or equal to about 10 ppm/° C. It is further preferable that the film thickness of the LiTaO₃ film is less than or equal to about 1.5λ, for example, in order to reduce the absolute value of the temperature coefficient of frequency TCF.

From FIG. 28, if the film thickness of the LiTaO₃ film is greater than about 1.5λ, the change in acoustic velocity is very small.

Figure 29:
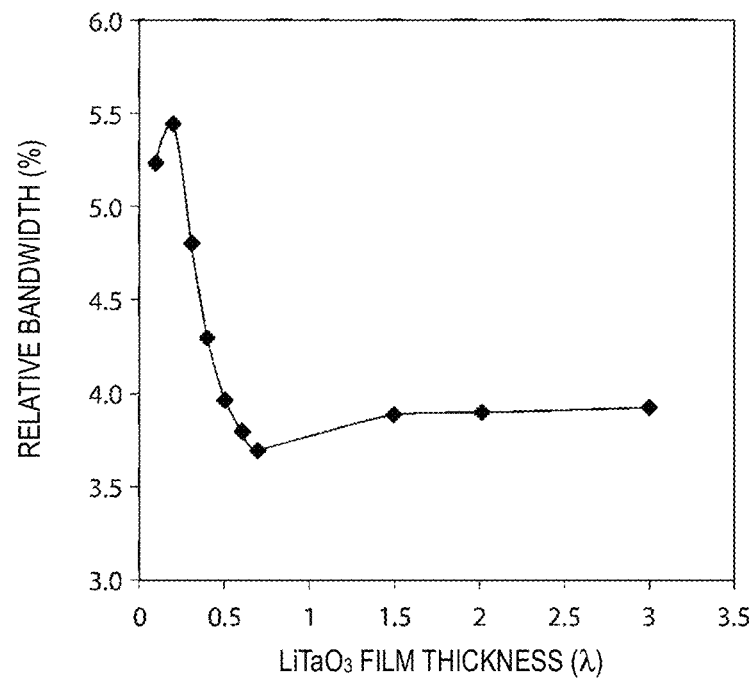
FIG. 29 is a diagram illustrating the relationship between the thickness of a piezoelectric film including $LiTaO_3$ and a relative band width.

As illustrated in FIG. 29, the relative bandwidth varies by a large amount in a film thickness range from about 0.05λ to about 0.5λ for the LiTaO₃ film. Therefore, the electromechanical coupling coefficient can be adjusted over a wider range. Therefore, it is preferable that the film thickness of the LiTaO₃ film is in a range from about 0.05λ to about 0.5λ, for example, in order to widen the range over which the electromechanical coupling coefficient and the relative bandwidth can be adjusted.

Figure 30:
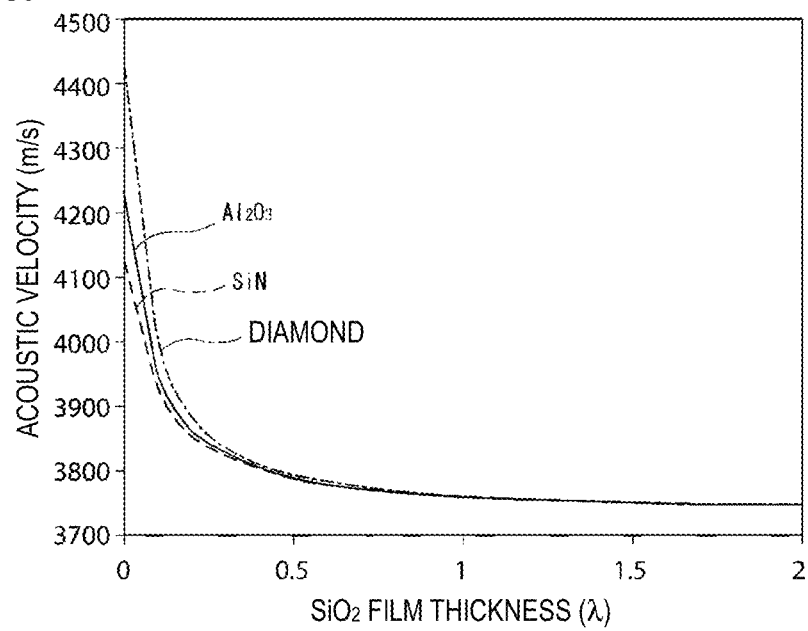
FIG. 30 is a diagram illustrating the relationship between the film thickness of a $SiO_2$ film, the material of a high-acoustic-velocity film, and acoustic velocity.
Figure 31:
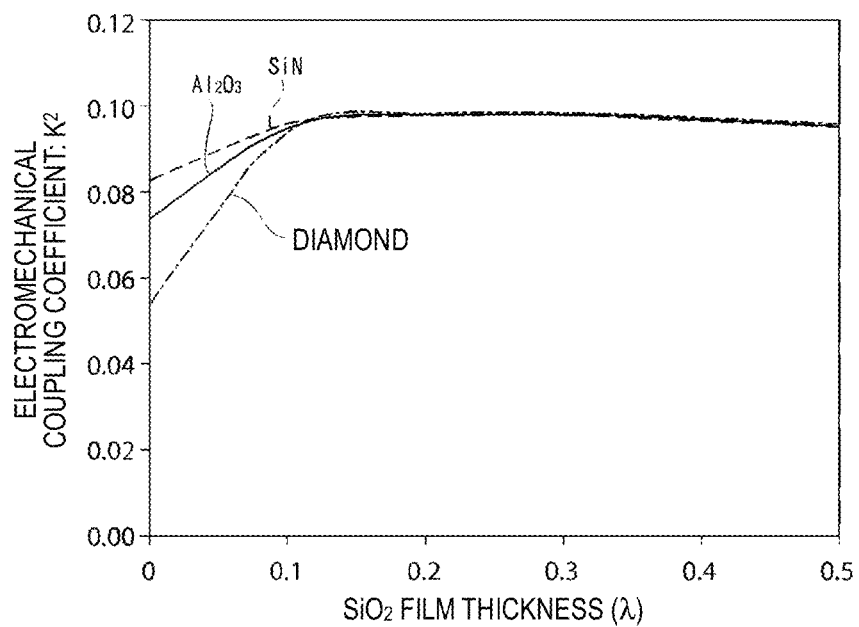
FIG. 31 is a diagram illustrating the relationships between the film thickness of a $SiO_2$ film, the material of a high-acoustic-velocity film, and the electromechanical coupling coefficient.

FIGS. 30 and 31 are diagrams respectively illustrating the relationships between the film thickness (λ) of the SiO₂ film and the acoustic velocity and the electromechanical coupling coefficient. Here, a silicon nitride film, an aluminum oxide film, and diamond were used as the high-acoustic-velocity film underneath the low-acoustic-velocity film including SiO₂. The film thickness of the high-acoustic-velocity film was about 1.5λ. The acoustic velocity of a bulk wave in silicon nitride is about 6000 m/s, the acoustic velocity of a bulk wave in aluminum oxide is about 6000 m/s, and the acoustic velocity of a bulk wave in diamond is about 12800 m/s. As illustrated in FIGS. 30 and 31, the electromechanical coupling coefficient and the acoustic velocity do not change substantially even when the material of the high-acoustic-velocity film and the film thickness of the SiO₂ film are changed. In particular, the electromechanical coupling coefficient does not substantially change regardless of the material of the high-acoustic-velocity film when the film thickness of the SiO₂ film lies in the range from about 0.1λ to about 0.5λ. Furthermore, it is clear from FIG. 30 that the acoustic velocity does not change regardless of the material of the high-acoustic-velocity film when the film thickness of the SiO₂ film lies in a range from about 0.3λ to about 2λ. Therefore, the film thickness of the low-acoustic-velocity film including silicon oxide is preferably less than or equal to about 2λ and more preferably less than or equal to about 0.5λ, for example.

Figure 32:
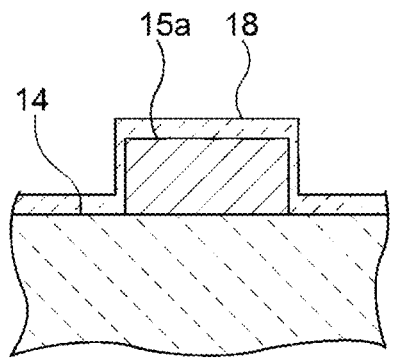
FIG. 32 is a partial enlarged front cross-sectional view for describing a modification in which the thickness of the protective film is different in different portions of the protective film.
Figure 33:
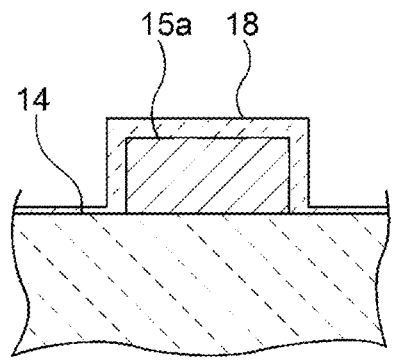
FIG. 33 is a partial enlarged front cross-sectional view for describing another modification in which the thickness of the protective film is different in different portions of the protective film.
Figure 34:
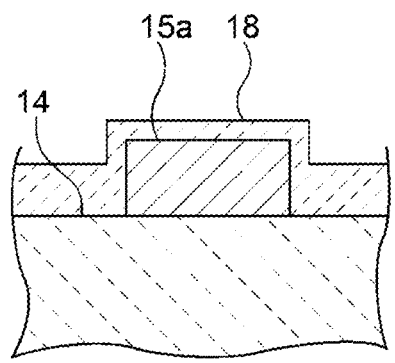
FIG. 34 is a partial enlarged front cross-sectional view for describing yet another modification in which the thickness of the protective film is different in different portions of the protective film.

FIGS. 32 to 34 are partial enlarged front cross-sectional views for describing modifications in which the thickness of the protective film is different in different portions of the protective film in an acoustic wave resonator used in a preferred embodiment of the present invention. In the modifications illustrated in FIGS. 32 to 34, the protective film 18 covers the lithium tantalate film 14 and the upper surfaces and side surfaces of electrode fingers 15a of the IDT electrode 15. In the modification illustrated in FIG. 32, the thickness of the portions of the protective film 18 covering the side surfaces of the electrode fingers 15a is smaller than the thickness of the portions of the protective film 18 covering the upper surfaces of the electrode fingers 15a. In this case, the Q value can be increased and the electromechanical coupling coefficient can be increased. In more detail, since the Qm of the protective film 18 is small, the Q value of the acoustic wave resonator can be increased by making the portions of the protective film 18 on the side surfaces of the electrode fingers 15a thinner. Therefore, the loss of the acoustic wave filter can be reduced. In addition, when the protective film 18 is provided on the lithium tantalate film 14, the difference in acoustic impedance between the portions where the electrode fingers 15a are provided and the gaps between the electrode fingers 15a becomes smaller. Therefore, the electromechanical coupling coefficient is reduced. However, the electromechanical coupling coefficient can be increased by reducing the thickness of the portions of the protective film 18 on the side surfaces of the electrode fingers 15a.

On the other hand, in the modification illustrated in FIG. 33, the thickness of the portions of the protective film 18 on the lithium tantalate film 14 is smaller than the thickness of the portions of the protective film 18 that cover the upper surfaces of the electrode fingers 15a. In this case as well, the electromechanical coupling coefficient can be increased. In other words, the electromechanical coupling coefficient can be increased by reducing the thickness of the portions of the protective film 18 that cover the lithium tantalate film 14.

In the modification illustrated in FIG. 34, the thickness of the portions of the protective film 18 on the lithium tantalate film 14 is larger than the thickness of the portions of the protective film 18 that cover the upper surfaces of the electrode fingers 15a. In this case, the electromechanical coupling coefficient can be reduced and a narrower bandwidth can be achieved.

Figure 35:
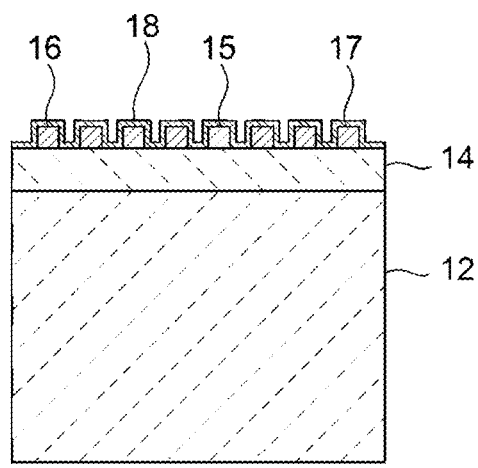
FIG. 35 is a front cross-sectional view illustrating a modification of an acoustic wave resonator used in an acoustic wave device according to a preferred embodiment of the present invention.

FIG. 35 is a front sectional view for describing a modification of an acoustic wave resonator used in a preferred embodiment of the present invention. The acoustic wave resonator of this modification is configured in the same or substantially the same way as the acoustic wave resonator 11 illustrated in FIG. 3A, except that the silicon oxide film 13 is not provided. Thus, an acoustic wave resonator used in a preferred embodiment of the present invention may have a structure in which the lithium tantalate film 14 is directly stacked above the silicon support substrate 12. In this case, the thickness of the silicon oxide film 13 is 0.

Figure 36:
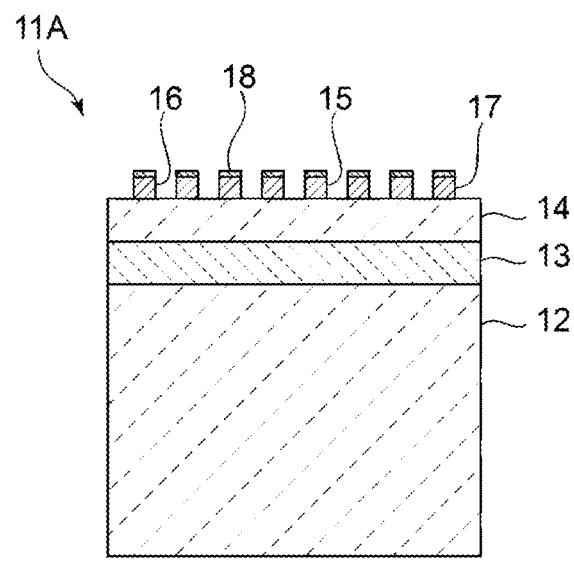
FIG. 36 is a front cross-sectional view illustrating yet another modification of an acoustic wave resonator used in an acoustic wave device according to a preferred embodiment of the present invention.

FIG. 36 is a front cross-sectional view illustrating yet another modification of an acoustic wave resonator used in an acoustic wave device according to a preferred embodiment of the present invention. In an acoustic wave resonator 11A, the protective film 18 is stacked on the upper surfaces of the electrode fingers of the IDT electrode 15. The protective film 18 does not extend onto the side surfaces of the electrode fingers of the IDT electrode 15. Thus, the protective film 18 may be stacked on only the upper surfaces of the electrode fingers.

Figure 37:
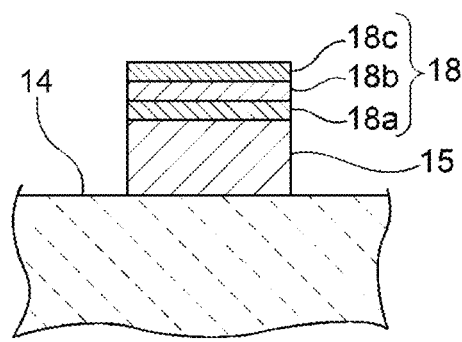
FIG. 37 is a partial enlarged front cross-sectional view for describing a modification in which the protective film is a multilayer film.

FIG. 37 is a partial front cross-sectional view for describing a structure in a case where the protective film 18 is multilayer film. The protective film 18 has a structure in which a first protective film layer 18a, a second protective film layer 18b, and a third protective film layer 18c are stacked on top of one another. Thus, the protective film 18 may be a multilayer film including a plurality of protective film layers. In this case, the wavelength-normalized thickness $T_P$ of the protective film 18 is obtained as the sum of the products of values obtained by dividing the density of each protective film layer by the density of silicon oxide and the wavelength normalized thicknesses of these protective film layers. For example, the wavelength-normalized thickness $T_P$ of the protective film 18 is provided by $T_P$=(d1/d0)t1+(d2/d0)t2+(d3/d0)t3, where d0 is the density of silicon oxide, d1 is the density and t1 is the wavelength-normalized thickness of the first protective film layer 18a, d2 is the density and t2 is the wavelength-normalized thickness of the second protective film layer 18b, and d3 is the density and t3 is the wavelength-normalized thickness of the third protective film layer 18c.

Figure 38:
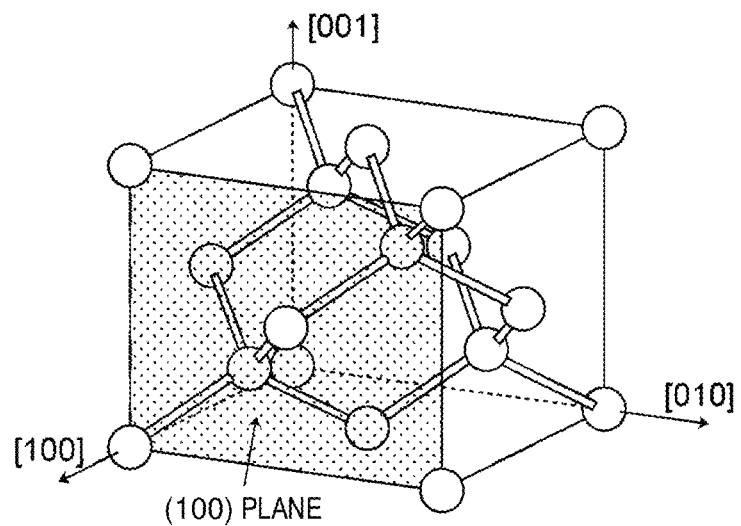
FIG. 38 is a schematic diagram for explaining a crystal orientation Si(100).

As illustrated in FIG. 38, Si(100) refers to a substrate that has been cut along the (100) plane perpendicular or substantially perpendicular to the crystal axis represented by the Miller index [100] in a silicon crystal structure having a diamond structure. Crystallographically equivalent planes such as Si(010) are also included.

Figure 39:
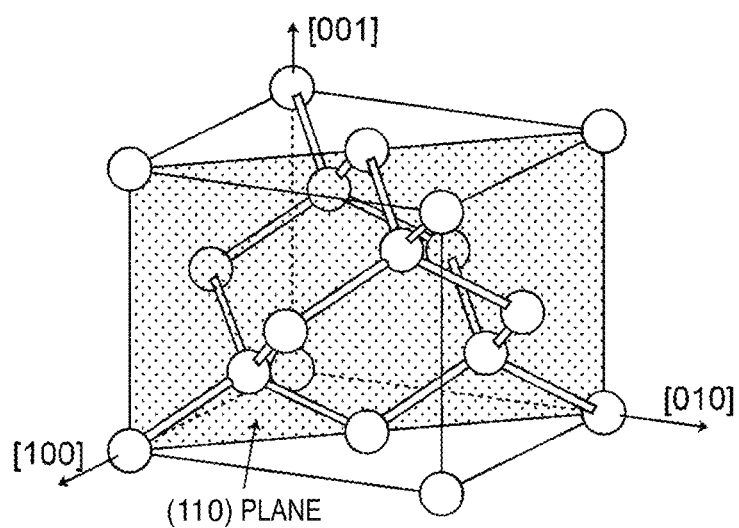
FIG. 39 is a schematic diagram for explaining a crystal orientation Si(110).

As illustrated in FIG. 39, Si(110) refers to a substrate that has been cut along the (110) plane perpendicular or substantially perpendicular to the crystal axis represented by the Miller index [110] in a silicon crystal structure having a diamond structure. Other crystallographically equivalent planes are also included.

Figure 40:
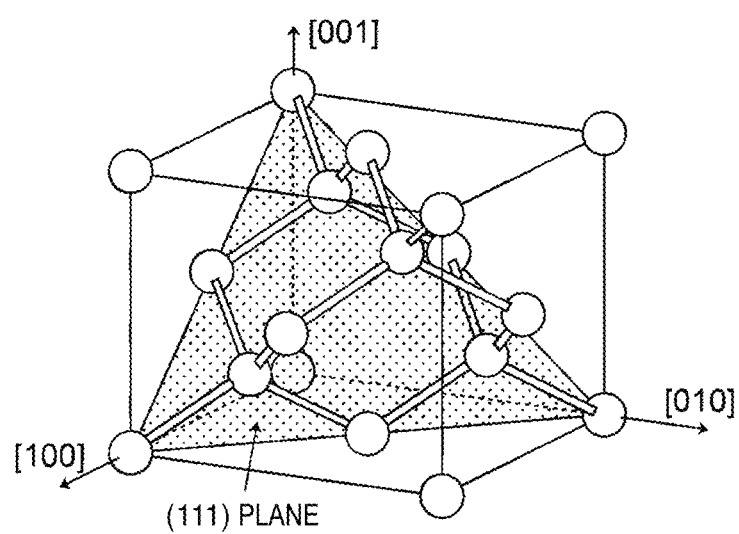
FIG. 40 is a schematic diagram for explaining a crystal orientation Si(111).

As illustrated in FIG. 40, Si(111) refers to a substrate that has been cut along the (111) plane perpendicular or substantially perpendicular to the crystal axis represented by the Miller index [111] in a silicon crystal structure having a diamond structure. Other crystallographically equivalent planes are also included.

The acoustic wave devices of the above-described preferred embodiments can be used as a component, such as a duplexer of a radio-frequency front end circuit, for example. An example of such a radio-frequency front end circuit will be described below.

Figure 41:
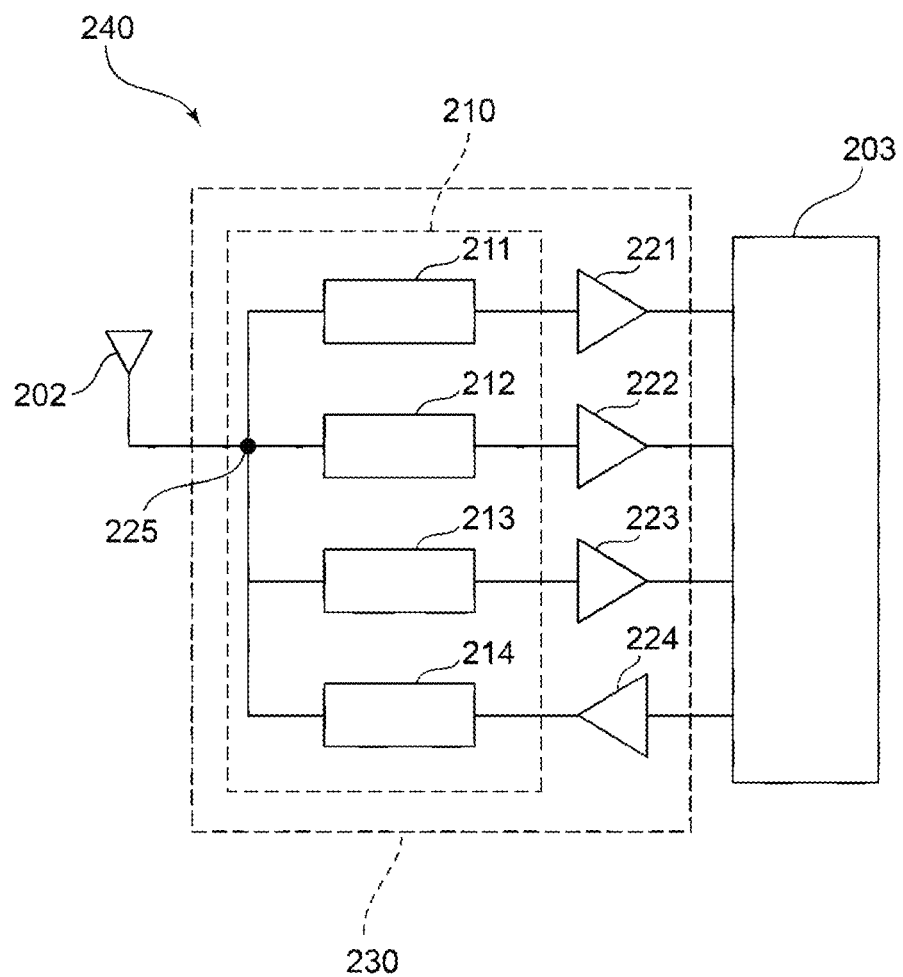
FIG. 41 is a schematic configuration diagram of a communication device including a radio-frequency front end circuit according to a preferred embodiment of the present invention.

FIG. 41 is a schematic configuration diagram of a communication device that includes a radio-frequency front end circuit. A communication device 240 includes an antenna 202, a radio-frequency front end circuit 230, and an RF signal processing circuit 203. The radio-frequency front end circuit 230 is a circuit portion that is connected to the antenna 202. The radio-frequency front end circuit 230 includes an acoustic wave device 210 and amplifiers 221 to 224. The acoustic wave device 210 includes first to fourth filters 211 to 214. The acoustic wave device of a preferred embodiment of the present invention described above can be used as the acoustic wave device 210. The acoustic wave device 210 includes an antenna common terminal 225 that is connected to the antenna 202. First terminals of the first to third filters 211 to 213, which are reception filters, and a first terminal of the fourth filter 214, which is a transmission filter, are all commonly connected to the antenna common terminal 225. Output terminals of the first to third filters 211 to 213 are respectively connected to the amplifiers 221 to 223. In addition, the amplifier 224 is connected to an input terminal of the fourth filter 214.

The output terminals of the amplifiers 221 to 223 are connected to the RF signal processing circuit 203. The input terminal of the amplifier 224 is connected to the RF signal processing circuit 203.

An acoustic wave device according to a preferred embodiment of the present invention can be suitably used as the acoustic wave device 210 in the communication device 240.

An acoustic wave device according to a preferred embodiment of the present invention can be used for various communication bands, but for example, it is suitable to use the pass bands of communication bands defined in the 3GPP standards as the pass band of the acoustic wave filters.

In addition, one or more acoustic wave resonators of an acoustic wave device according to a preferred embodiment of the present invention are preferably all acoustic wave resonators that satisfy Formula (3) or Formula (4). An acoustic wave device according to a preferred embodiment of the present invention can be used in various communication applications, but is preferably used as a carrier aggregation composite filter, for example. In other words, a carrier aggregation composite filter further includes an antenna terminal to which first ends of a plurality of acoustic wave filters are commonly connected, and three or more acoustic wave filters are commonly connected to the antenna terminal side. The plurality of acoustic wave filters simultaneously transmit and receive signals of a plurality of communication bands.

An acoustic wave device according to a preferred embodiment of the present invention may include only a plurality of transmission filters or may include a plurality of reception filters. The acoustic wave device includes n band pass filters, where n is greater than or equal to two. Therefore, a duplexer is also an acoustic wave device according to a preferred embodiment of the present invention.

Preferred embodiments of the present invention are widely applicable to communication devices such as mobile phones in the form of filters, acoustic wave devices applicable to multi-band systems, front end circuits, and communication devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
N band pass filters including first ends connected so as to define a common connection and having different pass bands from each other, where N is an integer greater than or equal to 2; wherein
when the N band pass filters are referred to as a band pass filter (1), a band pass filter (2), . . . and a band pass filter (N) in ascending order of pass band frequency, at least one band pass filter (n) (1≤n<N), other than a band pass filter having a highest pass band frequency, among the N band pass filters is an acoustic wave filter that includes one or more acoustic wave resonators;
at least one acoustic wave resonator (t) among the one or more acoustic wave resonators includes:
a silicon support substrate having Euler angles ($\varphi_{Si}$, $\theta_{Si}$, $\psi_{Si}$);
a silicon oxide film stacked above the silicon support substrate;
a lithium tantalate film stacked above the silicon oxide film and having Euler angles ($\varphi_{LT}$=0°±5°, $\theta_{LT}$, $\psi_{LT}$=0°±15°);
an IDT electrode provided above the lithium tantalate film and including electrode fingers; and
a protective film covering at least a portion of the IDT electrode; and
in the at least one acoustic wave resonator (t), when λ is a wavelength determined by an electrode finger pitch of the IDT electrode and a thickness normalized using the wavelength λ is referred to as a wavelength-normalized thickness, and when $T_{LT}$ is a wavelength-normalized thickness of the lithium tantalate film, $\theta_{LT}$ is a Euler angle of the lithium tantalate film, $T_S$ is a wavelength-normalized thickness of the silicon oxide film, $T_E$ is a wavelength-normalized thickness of the IDT electrode converted into a thickness of aluminum obtained as a product of a wavelength-normalized thickness of the IDT electrode and a value obtained by dividing a density of the IDT electrode by a density of aluminum, $T_P$ is a wavelength-normalized thickness of the protective film obtained as a product of a value obtained by dividing a density of the protective film by a density of silicon oxide and a wavelength-normalized thickness obtained by normalizing a thickness of the protective film using the wavelength $\lambda$, $\psi_{Si}$ is a propagation direction inside the silicon support substrate, and $T_{Si}$ is a wavelength-normalized thickness of the silicon support substrate, a first frequency $f_{h1\_t}^{(n)}$, where s=1 among first, second, and third frequencies $f_{hs\_t}^{(n)}$ determined by Formula (1) and Formula (2) determined using $T_{LT}$, $\theta_{LT}$, $T_S$, $T_E$, $T_P$, $\psi_{Si}$, and $T_{Si}$ and all band pass filters (m) (n<m≤N) having pass bands located at a higher frequency than the pass band of the band pass filter (n) satisfy Formula (3) or Formula (4):

$$V_h = \quad \text{Formula (1)}$$

$$\left(a_{T_{LT}}^{(3)}\left((T_{LT}-c_{T_{LT}})^3 - b_{T_{LT}}^{(3)}\right) + a_{T_{LT}}^{(2)}\left((T_{LT}-c_{T_{LT}})^2 - b_{T_{LT}}^{(2)}\right) + \right.$$

$$a_{T_{LT}}^{(1)}(T_{LT}-c_{T_{LT}}) + a_{T_S}^{(2)}\left((T_S-c_{T_S})^2 - b_{T_S}^{(2)}\right) +$$

$$a_{T_S}^{(1)}(T_S-c_{T_S}) + a_{T_E}^{(1)}(T_E-c_{T_E}) + a_{\psi_{Si}}^{(5)}\left((\psi_{Si}-c_{\psi_{Si}})^5 - b_{\psi_{Si}}^{(5)}\right) +$$

$$a_{\psi_{Si}}^{(4)}\left((\psi_{Si}-c_{\psi_{Si}})^4 - b_{\psi_{Si}}^{(4)}\right) + a_{\psi_{Si}}^{(3)}\left((\psi_{Si}-c_{\psi_{Si}})^3 - b_{\psi_{Si}}^{(3)}\right) +$$

$$a_{\psi_{Si}}^{(2)}\left((\psi_{Si}-c_{\psi_{Si}})^2 - b_{\psi_{Si}}^{(2)}\right) + a_{\psi_{Si}}^{(1)}(\psi_{Si}-c_{\psi_{Si}}) +$$

$$a_{\theta_{LT}}^{(2)}\left((\theta_{LT}-c_{\theta_{LT}})^2 - b_{\theta_{LT}}^{(2)}\right) + a_{\theta_{LT}}^{(1)}(\theta_{LT}-c_{\theta_{LT}}) +$$

$$d_{T_{LT}T_S}(T_{LT}-c_{T_{LT}})(T_S-c_{T_S}) + d_{T_{LT}T_E}(T_{LT}-c_{T_{LT}})$$

$$(T_E-c_{T_E}) + d_{T_{LT}\psi_{Si}}(T_{LT}-c_{T_{LT}})(\psi_{Si}-c_{\psi_{Si}}) + e)$$

$$\left(a_{T_P}T_P^3 + b_{T_P}T_P^2 + c_{T_P}T_P^2 + d_{T_P}\right);$$

$$f_{hs\_t}^{(n)} = \frac{V_{hs\_t}}{\lambda_t^{(n)}}; \quad \text{Formula (2)}$$

$$f_{hs\_t}^{(n)} > f_u^{(m)}; \quad \text{Formula (3)}$$

$$f_{hs\_t}^{(n)} < f_l^{(m)}; \quad \text{Formula (4)}$$

where s=1 in Formulas (2) to (4);

$\lambda_t^{(n)}$ is a wavelength determined by an electrode finger pitch of the IDT electrode of the at least one acoustic wave resonator (t) included in the band pass filter (n);

$f_u^{(m)}$ is a frequency of a high-frequency end of the pass band of the band pass filter (m);

$f_l^{(m)}$ is a frequency of a low-frequency end of the pass band of the band pass filter (m); and coefficients in Formula (1) have values as listed in Table 1 for various crystal orientations of the silicon support substrate:

TABLE 1

| | s = 1 | | |
|---|---|---|---|
| | Si(100) | Si(110) | Si(111) |
| $a_{TLT}^{(3)}$ | 0 | 0 | 0 |
| $a_{TLT}^{(2)}$ | 0 | 0 | 0 |
| $a_{TLT}^{(1)}$ | −436.3811104 | 0 | 0 |
| $b_{TLT}^{(3)}$ | 0 | 0 | 0 |
| $b_{TLT}^{(2)}$ | 0 | 0 | 0 |
| $c_{TLT}$ | 0.251271186 | 0 | 0 |
| $a_{TS}^{(2)}$ | 0 | 0 | 0 |
| $a_{TS}^{(1)}$ | −370.8189665 | 0 | −174.7116877 |
| $b_{TS}^{(2)}$ | 0 | 0 | 0 |

TABLE 1-continued

| | s = 1 | | |
|---|---|---|---|
| | Si(100) | Si(110) | Si(111) |
| $c_{TS}$ | 0.250529661 | 0 | 0.24371308 |
| $a_{TE}^{(1)}$ | 0 | 0 | 0 |
| $c_{TE}$ | 0 | 0 | 0 |
| $a_{\psi Si}^{(5)}$ | 0 | −6.73542E−06 | 0 |
| $a_{\psi Si}^{(4)}$ | 0 | −4.84328E−05 | 0.000703463 |
| $a_{\psi Si}^{(3)}$ | 0.044803063 | 0.020121569 | −4.77016E−05 |
| $a_{\psi Si}^{(2)}$ | −0.11149637 | 0.237494527 | −0.961938987 |
| $a_{\psi Si}^{(1)}$ | −43.37701861 | −1.22341255 | 0.091605753 |
| $b_{\psi Si}^{(5)}$ | 0 | −78830.27657 | 0 |
| $b_{\psi Si}^{(4)}$ | 0 | 1406271.562 | 340944.6167 |
| $b_{\psi Si}^{(3)}$ | 51.32996847 | −17.77613547 | −41.61537323 |
| $b_{\psi Si}^{(2)}$ | 280.2660593 | 895.2921635 | 446.7591732 |
| $c_{\psi Si}$ | 22.32521186 | 45.02689779 | 30.11392405 |
| $a_{\theta LT}^{(2)}$ | 0 | 0 | 0 |
| $a_{\theta LT}^{(1)}$ | 0 | 0 | 0 |
| $b_{\theta LT}^{(2)}$ | 0 | 0 | 0 |
| $c_{\theta LT}$ | −90 | −90 | −90 |
| $d_{TLTTS}$ | 0 | 0 | 0 |
| $d_{TLTTE}$ | 0 | 0 | 0 |
| $d_{TLT\psi Si}$ | 0 | 0 | 0 |
| e | 5141.869703 | 5073.066348 | 4781.489451 |
| $a_{TP}$ | 0 | 0 | 0 |
| $b_{TP}$ | 0.02 | 0.02 | 0.02 |
| $c_{TP}$ | −0.0102 | −0.0102 | −0.0102 |
| $d_{TP}$ | 1.0002 | 1.0002 | 1.0002. |

2. The acoustic wave device according to claim 1, wherein the values of $T_{LT}$, $\theta_{LT}$, $T_S$, $T_N$, $T_E$, $T_P$, $\psi_{Si}$, and $T_{Si}$ are selected so that the second frequency $f_{h2\_t}^{(n)}$ satisfies Formula (3) or Formula (4).

3. The acoustic wave device according to claim 1, wherein the values of $T_{LT}$, $\theta_{LT}$, $T_S$, $T_N$, $T_E$, $T_P$, $\psi_{Si}$, and $T_{Si}$ are selected so that the third frequency $f_{h3\_t}^{(n)}$ satisfies Formula (3) or Formula (4).

4. The acoustic wave device according to claim 1, wherein the values of $T_{LT}$, $\theta_{LT}$, $T_S$, $T_N$, $T_E$, $T_P$, $\psi_{Si}$, and $T_{Si}$ are selected so that the second and third frequencies $f_{h2\_t}^{(n)}$ and $f_{h3\_t}^{(n)}$ satisfy Formula (3) or Formula (4).

5. The acoustic wave device according to claim 1, wherein a film thickness of the silicon oxide film is less than or equal to about 2λ.

6. The acoustic wave device according to claim 1, wherein the wavelength-normalized thickness $T_{Si}$ of the silicon support substrate is >about 4.

7. The acoustic wave device according to claim 6, wherein $T_{Si}$>about 10.

8. The acoustic wave device according to claim 1, wherein the wavelength-normalized thickness of the lithium tantalate film is less than or equal to about 3.5.

9. The acoustic wave device according to claim 8, wherein the wavelength-normalized thickness of the lithium tantalate film is less than or equal to about 2.5.

10. The acoustic wave device according to claim 8, wherein the wavelength-normalized thickness of the lithium tantalate film is less than or equal to about 1.5.

11. The acoustic wave device according to claim 8, wherein the wavelength-normalized thickness of the lithium tantalate film is less than or equal to about 0.5.

12. The acoustic wave device according to claim 1, wherein
the protective film covers the lithium tantalate film and side surfaces and upper surfaces of the electrode fingers of the IDT electrode; and
a thickness of portions of the protective film on the side surfaces of the electrode fingers is smaller than a thickness of portions of the protective film that cover the upper surfaces of the electrode fingers.

13. The acoustic wave device according to claim 1, wherein
the protective film covers the lithium tantalate film and side surfaces and upper surfaces of the electrode fingers of the IDT electrode; and
a thickness of portions of the protective film on the lithium tantalate film is smaller than a thickness of portions of the protective film that cover the upper surfaces of the electrode fingers.

14. The acoustic wave device according to claim 1, wherein
the protective film covers the lithium tantalate film and upper surfaces and side surfaces of the IDT electrode; and
a thickness of portions of the protective film on the lithium tantalate film is larger than a thickness of portions of the protective film that cover the upper surfaces of the electrode fingers.

15. The acoustic wave device according to claim 1, further comprising:
an antenna terminal to which first ends of the plurality of band pass filters are connected so as to define the common connection; wherein
an acoustic wave resonator of the one or more acoustic wave resonators that is nearest the antenna terminal satisfies Formula (3) or Formula (4).

16. The acoustic wave device according to claim 1, wherein all of the one or more acoustic wave resonators satisfy Formula (3) or Formula (4).

17. The acoustic wave device according to claim 1, wherein the acoustic wave device is a duplexer.

18. The acoustic wave device according to claim 1, wherein the acoustic wave device is a composite filter that further comprises an antenna terminal to which first ends of the plurality of band pass filters are commonly connected and three or more of the band pass filters connected at a side near the antenna terminal so as to define the common connection.

19. The acoustic wave device according to claim 1, wherein the acoustic wave filter including the one or more acoustic wave resonators is a ladder filter that includes a plurality of series arm resonators and a plurality of parallel arm resonators.

20. An acoustic wave device comprising:
N band pass filters including first ends connected so as to define a common connection and having different pass bands from each other, where N is an integer greater than or equal to 2; wherein
when the N band pass filters are referred to as a band pass filter (1), a band pass filter (2), . . . and a band pass filter (N) in ascending order of pass band frequency, at least one band pass filter (n) (1≤n<N), other than the band pass filter having a highest pass band frequency, among the N band pass filters is an acoustic wave filter that includes one or more acoustic wave resonators;
at least one acoustic wave resonator (t) among the one or more acoustic wave resonators includes:
a silicon support substrate having Euler angles ($\varphi_{Si}$, $\theta_{Si}$, $\psi_{Si}$);
a silicon oxide film stacked above the silicon support substrate;
a lithium tantalate film stacked above the silicon oxide film and having Euler angles ($\theta_{LT}=0°\pm5°$, $\theta_{LT}$, $\psi_{LT}=0°\pm15°$);
an IDT electrode provided above the lithium tantalate film and including electrode fingers; and
a protective film covering at least a portion of the IDT electrode; and
in the at least one acoustic wave resonator (t), when λ is a wavelength determined by an electrode finger pitch of the IDT electrode and a thickness normalized using the wavelength λ is referred to as a wavelength-normalized thickness, and when $T_{LT}$ is a wavelength-normalized thickness of the lithium tantalate film, $\theta_{LT}$ is a Euler angle of the lithium tantalate film, $T_S$ is a wavelength-normalized thickness of the silicon oxide film, $T_E$ is a wavelength-normalized thickness of the IDT electrode converted into a thickness of aluminum obtained as a product of a wavelength-normalized thickness of the IDT electrode and a value obtained by dividing a density of the IDT electrode by a density of aluminum, $T_P$ is a wavelength-normalized thickness of the protective film obtained as a product of a value obtained by dividing a density of the protective film by a density of silicon oxide and a wavelength-normalized thickness obtained by normalizing a thickness of the protective film using the wavelength λ, $\psi_{Si}$ is a propagation direction inside the silicon support substrate, and $T_{Si}$ is a wavelength-normalized thickness of the silicon support substrate, a second frequency $f_{h2\_t}^{(n)}$, where s=2 among first, second, and third frequencies $f_{hs\_t}^{(n)}$ determined by Formula (1) and Formula (2) determined using $T_{LT}$, $\theta_{LT}$, $T_S$, $T_E$, $T_P$, $\psi_{Si}$, and $T_{Si}$ and all band pass filters (m) (n<m≤N) having pass bands located at a higher frequency than the pass band of the band pass filter (n) satisfy Formula (3) or Formula (4):

$$V_h = \quad \text{Formula (1)}$$

$$(a_{T_{LT}}^{(3)}((T_{LT}-c_{T_{LT}})^3 - b_{T_{LT}}^{(3)}) + a_{T_{LT}}^{(2)}((T_{LT}-c_{T_{LT}})^2 - b_{T_{LT}}^{(2)}) +$$
$$a_{T_{LT}}^{(1)}(T_{LT}-c_{T_{LT}}) + a_{T_S}^{(2)}((T_S-c_{T_S})^2 - b_{T_S}^{(2)}) +$$
$$a_{T_S}^{(1)}(T_S-c_{T_S}) + a_{T_E}^{(1)}(T_E-c_{T_E}) + a_{\psi_{Si}}^{(5)}((\psi_{Si}-c_{\psi_{Si}})^5 - b_{\psi_{Si}}^{(5)}) +$$
$$a_{\psi_{Si}}^{(4)}((\psi_{Si}-c_{\psi_{Si}})^4 - b_{\psi_{Si}}^{(4)}) + a_{\psi_{Si}}^{(3)}((\psi_{Si}-c_{\psi_{Si}})^3 - b_{\psi_{Si}}^{(3)}) +$$
$$a_{\psi_{Si}}^{(2)}((\psi_{Si}-c_{\psi_{Si}})^2 - b_{\psi_{Si}}^{(2)}) + a_{\psi_{Si}}^{(1)}(\psi_{Si}-c_{\psi_{Si}}) +$$
$$a_{\theta_{LT}}^{(2)}((\theta_{LT}-c_{\theta_{LT}})^2 - b_{\theta_{LT}}^{(2)}) + a_{\theta_{LT}}^{(1)}(\theta_{LT}-c_{\theta_{LT}}) +$$
$$d_{T_{LT}T_S}(T_{LT}-c_{T_{LT}})(T_S-c_{T_S}) + d_{T_{LT}T_E}(T_{LT}-c_{T_{LT}})$$
$$(T_E-c_{T_E}) + d_{T_{LT}\psi_{Si}}(T_{LT}-c_{T_{LT}})(\psi_{Si}-c_{\psi_{Si}}) + e)$$
$$(a_{T_P}T_P^3 + b_{T_P}T_P^2 + c_{T_P}T_P^2 + d_{T_P});$$

$$f_{hs\_t}^{(n)} = \frac{V_{hs\_t}}{\lambda_t^{(n)}}; \quad \text{Formula (2)}$$

$$f_{hs\_t}^{(n)} > f_u^{(m)}; \quad \text{Formula (3)}$$

$$f_{hs\_t}^{(n)} < f_l^{(m)}; \quad \text{Formula (4)}$$

where s=2 in Formulas (2) to (4);
$\lambda_t^{(n)}$ is a wavelength determined by an electrode finger pitch of the IDT electrode of the at least one acoustic wave resonator (t) included in the band pass filter (n);
$f_u^{(m)}$ is a frequency of a high-frequency end of the pass band of the band pass filter (m);
$f_l^{(m)}$ is a frequency of a low-frequency end of the pass band of the band pass filter (m); and
coefficients in Formula (1) have values as listed in Table 2 for various crystal orientations of the silicon support substrate:

TABLE 2

| | s = 2 | | |
|---|---|---|---|
| | Si(100) | Si(110) | Si(111) |
| $a_{TLT}^{(3)}$ | 0 | 0 | 0 |
| $a_{TLT}^{(2)}$ | −3168.980655 | −3017.48047 | −6490.588929 |
| $a_{TLT}^{(1)}$ | −1070.770975 | −1740.800945 | −1736.124534 |
| $b_{TLT}^{(3)}$ | 0 | 0 | 0 |
| $b_{TLT}^{(2)}$ | 0.012520877 | 0.011673567 | 0.012932291 |
| $c_{TLT}$ | 0.25 | 0.26454918 | 0.244042365 |
| $a_{TS}^{(2)}$ | 0 | 0 | −5447.157686 |
| $a_{TS}^{(1)}$ | −1175.713239 | −1443.794269 | −1260.230106 |
| $b_{TS}^{(2)}$ | 0 | 0 | 0.012411464 |
| $c_{TS}$ | 0.250104384 | 0.264754098 | 0.243336275 |
| $a_{TE}^{(1)}$ | −440.9839549 | −631.5739347 | −613.3480905 |
| $c_{TE}$ | 0.249686848 | 0.254030055 | 0.249646955 |
| $a_{\psi Si}^{(5)}$ | 0 | 0 | 0 |
| $a_{\psi Si}^{(4)}$ | 0 | −8.39122E−05 | 0 |
| $a_{\psi Si}^{(3)}$ | −0.01385161 | −0.000219614 | 0 |
| $a_{\psi Si}^{(2)}$ | 0.040113138 | 0.288564318 | 0.113517332 |
| $a_{\psi Si}^{(1)}$ | 10.06827612 | −1.021332326 | 0.01604077 |
| $b_{\psi Si}^{(5)}$ | 0 | 0 | 0 |
| $b_{\psi Si}^{(4)}$ | 0 | 1489555.068 | 0 |
| $b_{\psi Si}^{(3)}$ | −14.09179662 | −1671.679914 | 0 |
| $b_{\psi Si}^{(2)}$ | 281.2490194 | 936.1444126 | 446.7377612 |
| $c_{\psi Si}$ | 22.53131524 | 46.09631148 | 29.70873786 |
| $a_{\theta LT}^{(2)}$ | 0 | 0 | 0 |
| $a_{\theta LT}^{(1)}$ | −2.926997787 | 0 | 0 |
| $b_{\theta LT}^{(2)}$ | 0 | 0 | 0 |
| $c_{\theta LT}$ | −50.02087683 | −90 | −90 |
| $d_{TLTTS}$ | 0 | 0 | 0 |
| $d_{TLTTE}$ | −2151.133017 | −2785.629029 | −2639.620065 |
| $d_{TLT\psi Si}$ | 17.13925013 | 0 | 0 |
| e | 5188.573706 | 5052.799929 | 5187.888817 |
| $a_{TP}$ | 0 | 0 | 0 |
| $b_{TP}$ | −0.1336 | −0.1336 | −0.1336 |
| $c_{TP}$ | −0.0552 | −0.0552 | −0.0552 |
| $d_{TP}$ | 1.001 | 1.001 | 1.001 |

21. The acoustic wave device according to claim 20, wherein the values of $T_{LT}$, $\theta_{LT}$, $T_S$, $T_N$, $T_E$, $T_P$, $\psi_{Si}$, and $T_{Si}$ are selected so that the third frequency $f_{h3\_t}^{(n)}$ satisfies Formula (3) or Formula (4).

22. An acoustic wave device comprising:
N band pass filters having first ends connected so as to define a common connection and having different pass bands from each other, where N is an integer greater than or equal to 2; wherein
when the N band pass filters are referred to as a band pass filter (1), a band pass filter (2), . . . and a band pass filter (N) in ascending order of pass band frequency, at least one band pass filter (n) (1≤n<N), other than the band pass filter having a highest pass band frequency, among the N band pass filters is an acoustic wave filter that includes one or more acoustic wave resonators;
at least one acoustic wave resonator (t) among the one or more acoustic wave resonators includes:
a silicon support substrate having Euler angles ($\varphi_{Si}$, $\theta_{Si}$, $\psi_{Si}$);
a silicon oxide film stacked above the silicon support substrate;
a lithium tantalate film stacked above the silicon oxide film and having Euler angles ($\varphi_{LT}=0°\pm5°$, $\theta_{LT}$, $\psi_{LT}=0°\pm15°$);
an IDT electrode provided above the lithium tantalate film and including electrode fingers; and
a protective film that covers at least part of the IDT electrode; and
in the at least one acoustic wave resonator (t), when λ is a wavelength determined by an electrode finger pitch of the IDT electrode and a thickness normalized using the wavelength $\theta_{LT}$ is referred to as a wavelength-normalized thickness, and when $T_{LT}$ is a wavelength-normalized thickness of the lithium tantalate film, $\theta_{LT}$ is a Euler angle of the lithium tantalate film, $T_S$ is a wavelength-normalized thickness of the silicon oxide film, $T_E$ is a wavelength-normalized thickness of the IDT electrode converted into a thickness of aluminum obtained as a product of a wavelength-normalized thickness of the IDT electrode and a value obtained by dividing a density of the IDT electrode by a density of aluminum, $T_P$ is a wavelength-normalized thickness of the protective film obtained as a product of a value obtained by dividing a density of the protective film by a density of silicon oxide and a wavelength-normalized thickness obtained by normalizing a thickness of the protective film using the wavelength $\theta_{LT}$, $\psi_{Si}$ is a propagation direction inside the silicon support substrate, and $T_{Si}$ is a wavelength-normalized thickness of the silicon support substrate, a third frequency $f_{h3\_t}^{(n)}$, where s=3 among first, second, and third frequencies $f_{hs\_t}^{(n)}$ determined by Formula (1) and Formula (2) determined using $T_{LT}$, $\theta_{LT}$, $T_S$, $T_E$, $T_P$, $\psi_{Si}$, and $T_{Si}$ and all band pass filters (m) (n<m≤N) having pass bands located at a higher frequency than the pass band of the band pass filter (n) satisfy Formula (3) or Formula (4):

$$V_h = \quad \text{Formula (1)}$$

$$\left(a_{TLT}^{(3)}\left((T_{LT}-c_{TLT})^3 - b_{TLT}^{(3)}\right) + a_{TLT}^{(2)}\left((T_{LT}-c_{TLT})^2 - b_{TLT}^{(2)}\right) + \right.$$
$$a_{TLT}^{(1)}(T_{LT}-c_{TLT}) + a_{TS}^{(2)}\left((T_S-c_{TS})^2 - b_{TS}^{(2)}\right) +$$
$$a_{TS}^{(1)}(T_S-c_{TS}) + a_{TE}^{(1)}(T_E-c_{TE}) + a_{\psi Si}^{(5)}\left((\psi_{Si}-c_{\psi Si})^5 - b_{\psi Si}^{(5)}\right) +$$
$$a_{\psi Si}^{(4)}\left((\psi_{Si}-c_{\psi Si})^4 - b_{\psi Si}^{(4)}\right) + a_{\psi Si}^{(3)}\left((\psi_{Si}-c_{\psi Si})^3 - b_{\psi Si}^{(3)}\right) +$$
$$a_{\psi Si}^{(2)}\left((\psi_{Si}-c_{\psi Si})^2 - b_{\psi Si}^{(2)}\right) + a_{\psi Si}^{(1)}(\psi_{Si}-c_{\psi Si}) +$$
$$a_{\theta LT}^{(2)}\left((\theta_{LT}-c_{\theta LT})^2 - b_{\theta LT}^{(2)}\right) + a_{\theta LT}^{(1)}(\theta_{LT}-c_{\theta LT}) +$$
$$d_{TLTTS}(T_{LT}-c_{TLT})(T_S-c_{TS}) + d_{TLTTE}(T_{LT}-c_{TLT})$$
$$\left.(T_E-c_{TE}) + d_{TLT\psi Si}(T_{LT}-c_{TLT})(\psi_{Si}-c_{\psi Si}) + e\right)$$
$$(a_{TP}T_P^3 + b_{TP}T_P^2 + c_{TP}T_P^2 + d_{TP});$$

$$f_{hs\_t}^{(n)} = \frac{V_{hs\_t}}{\lambda_t^{(n)}}; \quad \text{Formula (2)}$$

$$f_{hs\_t}^{(n)} > f_u^{(m)}; \quad \text{Formula (3)}$$

$$f_{hs\_t}^{(n)} < f_l^{(m)}; \quad \text{Formula (4)}$$

and where s=3 in Formulas (2) to (4);

$\lambda_t^{(n)}$ is a wavelength determined by an electrode finger pitch of the IDT electrode of the at least one acoustic wave resonator (t) included in the band pass filter (n);

$f_u^{(m)}$ is a frequency of a high-frequency end of the pass band of the band pass filter (m);

$f_l^{(m)}$ is a frequency of a low-frequency end of the pass band of the band pass filter (m); and coefficients in Formula (1) have values as listed in Table 3 for various crystal orientations of the silicon support substrate:

TABLE 3

|  | s = 3 | | |
| --- | --- | --- | --- |
|  | Si(100) | Si(110) | Si(111) |
| $a_{TLT}^{(3)}$ | 24973.69604 | 0 | 0 |
| $a_{TLT}^{(2)}$ | 1430.312613 | 0 | −6156.310187 |
| $a_{TLT}^{(1)}$ | −1027.290569 | −737.4915071 | −1476.525631 |
| $b_{TLT}^{(3)}$ | −0.000364885 | 0 | 0 |
| $b_{TLT}^{(2)}$ | 0.011041041 | 0 | 0.009760415 |
| $c_{TLT}$ | 0.277376171 | 0.283128295 | 0.290986602 |
| $a_{TS}^{(2)}$ | 0 | 0 | 0 |
| $a_{TS}^{(1)}$ | −617.9601012 | 0 | 0 |
| $b_{TS}^{(2)}$ | 0 | 0 | 0 |
| $c_{TS}$ | 0.273226238 | 0 | 0 |
| $a_{TE}^{(1)}$ | −254.0645301 | −400.406917 | −524.8090015 |
| $c_{TE}$ | 0.262449799 | 0.265026362 | 0.25499391 |
| $a_{\psi,Si}^{(5)}$ | 0 | 0 | 0 |
| $a_{\psi,Si}^{(4)}$ | 0 | −0.000208283 | −0.000637441 |
| $a_{\psi,Si}^{(3)}$ | 0 | −0.004709453 | −0.001817349 |
| $a_{\psi,Si}^{(2)}$ | −0.126294383 | 0.574442977 | 0.749991624 |
| $a_{\psi,Si}^{(1)}$ | 2.746835794 | 7.891650217 | −0.116425099 |
| $b_{\psi,Si}^{(5)}$ | 0 | 0 | 0 |
| $b_{\psi,Si}^{(4)}$ | 0 | 1654327.754 | 303345.3736 |
| $b_{\psi,Si}^{(3)}$ | 0 | −7229.860818 | −201.8986483 |
| $b_{\psi,Si}^{(2)}$ | 266.9400494 | 985.3381236 | 411.1815157 |
| $c_{\psi,Si}$ | 22.10843373 | 47.8602812 | 30.42021924 |
| $a_{\theta LT}^{(2)}$ | 0 | 0 | 0.593925697 |
| $a_{\theta LT}^{(1)}$ | 0 | 0 | −2.75182308 |
| $b_{\theta LT}^{(2)}$ | 0 | 0 | 67.60597649 |
| $c_{\theta LT}$ | −90 | −90 | −49.6589525 |
| $d_{TLTTS}$ | −2391.060714 | 0 | 0 |
| $d_{TLTTE}$ | 0 | 0 | −2773.934251 |
| $d_{TLT\psi,Si}$ | −12.5134053 | 15.88855602 | 0 |
| e | 5661.675305 | 5417.174527 | 5440.57579 |
| $a_{TP}$ | 10.443 | 10.443 | 10.443 |
| $b_{TP}$ | −0.0316 | −0.0316 | −0.0316 |
| $c_{TP}$ | −0.0653 | −0.0653 | −0.0653 |
| $d_{TP}$ | 1.0011 | 1.0011 | 1.0011. |

\* \* \* \* \*